(12) United States Patent
Kong et al.

(10) Patent No.: US 11,592,707 B2
(45) Date of Patent: Feb. 28, 2023

(54) DISPLAY DEVICE

(71) Applicant: LG ELECTRONICS INC., Seoul (KR)

(72) Inventors: Junhee Kong, Seoul (KR); Byungchun Yoo, Seoul (KR); Insuk Jeong, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 0 days.

(21) Appl. No.: 17/843,376

(22) Filed: Jun. 17, 2022

(65) Prior Publication Data
US 2022/0404672 A1  Dec. 22, 2022

(30) Foreign Application Priority Data

Jun. 21, 2021 (KR) .................. 10-2021-0079805
Nov. 26, 2021 (WO) ................ PCT/KR2021/017666

(51) Int. Cl.
*G02F 1/13357* (2006.01)
*G02F 1/1333* (2006.01)
(Continued)

(52) U.S. Cl.
CPC ............ *G02F 1/133605* (2013.01); *G02F 1/133317* (2021.01); *G02F 1/133614* (2021.01); *G02F 1/133603* (2013.01); *H01L 25/13* (2013.01)

(58) Field of Classification Search
CPC ......... G02F 1/133605; G02F 1/133317; G02F 1/133614
See application file for complete search history.

(56) References Cited

U.S. PATENT DOCUMENTS

2008/0018826 A1* 1/2008 Bae .................. G02F 1/133308
349/58
2010/0171897 A1* 7/2010 Yun ................. G02F 1/133605
349/58
(Continued)

FOREIGN PATENT DOCUMENTS

JP    2002-082624    3/2002
KR   10-1246017     3/2013
(Continued)

OTHER PUBLICATIONS

PCT International Application No. PCT/KR2021/017666, International Search Report dated Mar. 25, 2022, 3 pages.

*Primary Examiner* — Evan P Dzierzynski
(74) *Attorney, Agent, or Firm* — Lee Hong Degerman Kang Waimey

(57) ABSTRACT

Disclosed is a display device. The display device includes a display panel; a frame positioned in a rearward direction of the display panel; a substrate which is positioned on the frame, and has a light source providing light; an inner frame which is coupled to the frame, and supports the display panel; an optical layer which is positioned between the display panel and the inner frame, and in contact with the inner frame; and a side reflector which is positioned between the optical layer and the frame, and coupled to the inner frame, wherein the side reflector includes: a base surface positioned adjacent to the substrate; an inclination surface which is positioned adjacent to a lower surface of the optical layer, and reflects the light provided from the light source to the optical layer; and a side surface which connects the base surface and the inclination surface, and reflects the light provided by the light source.

10 Claims, 33 Drawing Sheets

(51) Int. Cl.
*G02F 1/1335* (2006.01)
*H01L 25/13* (2006.01)

(56) References Cited

U.S. PATENT DOCUMENTS

| | | | | |
|---|---|---|---|---|
| 2016/0187709 A1* | 6/2016 | Lee | ............... | H05K 1/189 |
| | | | | 349/58 |
| 2017/0083273 A1* | 3/2017 | Kim | ............... | G02F 1/133317 |
| 2021/0181582 A1* | 6/2021 | Yoon | ............... | G02F 1/133606 |

FOREIGN PATENT DOCUMENTS

| | | |
|---|---|---|
| KR | 10-1363587 | 2/2014 |
| KR | 10-1647490 | 8/2016 |
| KR | 10-2046766 | 11/2019 |

\* cited by examiner

222

DISPLAY DEVICE

CROSS-REFERENCE TO RELATED APPLICATIONS

Pursuant to 35 U.S.C. § 119, this application claims the benefit of an earlier filing date and right of priority to Korean Patent Application No. 10-2021-0079805, filed on Jun. 21, 2021, and also claims the benefit of International Application No. PCT/KR2021/017666, filed on Nov. 26, 2021, the contents of which are all incorporated by reference herein in their entirety.

BACKGROUND OF THE INVENTION

1. Field of the Invention

The present disclosure relates to a display device.

2. Description of the Related Art

As the information society develops, the demand for display devices is also increasing in various forms. In response to this, various display devices such as Liquid Crystal Display Device (LCD), Organic Light Emitting Diode (OLED), Micro LED have been researched and used in recent years.

Among them, a liquid crystal panel of the LCD includes a liquid crystal layer, and a TFT substrate and a color filter substrate facing each other with the liquid crystal layer interposed therebetween, and may display an image by using light provided from a backlight unit.

Recently, as interest in the image quality of display device increases, color expression or color reproducibility close to true color is receiving important attention, and a lot of research has been accomplished on the image quality improvement to improve light uniformity and to implement natural colors.

SUMMARY OF THE INVENTION

An object of the present disclosure is to solve the above and other problems. Another object may be to provide a display device capable of improving image quality.

Another object may be to provide a display device capable of improving luminance and light uniformity of a backlight unit.

Another object may be to provide a display device capable of effectively controlling light provided from a backlight unit.

Another object may be to improve the purity of white light by improving the bluish phenomenon of light provided from a backlight unit.

Another object may be to provide a coupling structure of a display device capable of improving luminance and light uniformity.

Another object may be to provide a display device having a robust coupling structure while reducing an optical depth.

In accordance with an aspect of the present invention, a display device includes a display panel; a frame positioned in a rearward direction of the display panel; a substrate which is positioned on the frame, and has a light source providing light; an inner frame which is coupled to the frame, and supports the display panel; an optical layer which is positioned between the display panel and the inner frame, and in contact with the inner frame; and a side reflector which is positioned between the optical layer and the frame, and coupled to the inner frame, wherein the side reflector includes: a base surface positioned adjacent to the substrate; an inclination surface which is positioned adjacent to a lower surface of the optical layer, and reflects the light provided from the light source to the optical layer; and a side surface which connects the base surface and the inclination surface, and reflects the light provided by the light source.

BRIEF DESCRIPTION OF THE DRAWINGS

The above and other objects, features and advantages of the present invention will be more apparent from the following detailed description in conjunction with the accompanying drawings, in which.

DETAILED DESCRIPTION OF THE PREFERRED EMBODIMENTS

Description will now be given in detail according to exemplary embodiments disclosed herein, with reference to the accompanying drawings. For the sake of brief description with reference to the drawings, the same or equivalent components may be denoted by the same reference numbers, and description thereof will not be repeated.

In general, suffixes such as "module" and "unit" may be used to refer to elements or components. Use of such suffixes herein is merely intended to facilitate description of the specification, and the suffixes do not have any special meaning or function.

In addition, in the present disclosure, that which is well known to one of ordinary skill in the relevant art has generally been omitted for the sake of brevity.

In addition, the accompanying drawings are used to assist in easy understanding of various technical features and it should be understood that the embodiments presented herein are not limited by the accompanying drawings. As such, the present disclosure should be construed to extend to any alterations, equivalents and substitutes in addition to those which are particularly set out in the accompanying drawings.

Hereinafter, a liquid crystal panel (LCD) will be described as an example for a display panel, but the display panel applicable to the present disclosure is not limited to the liquid crystal panel.

Figure 1:
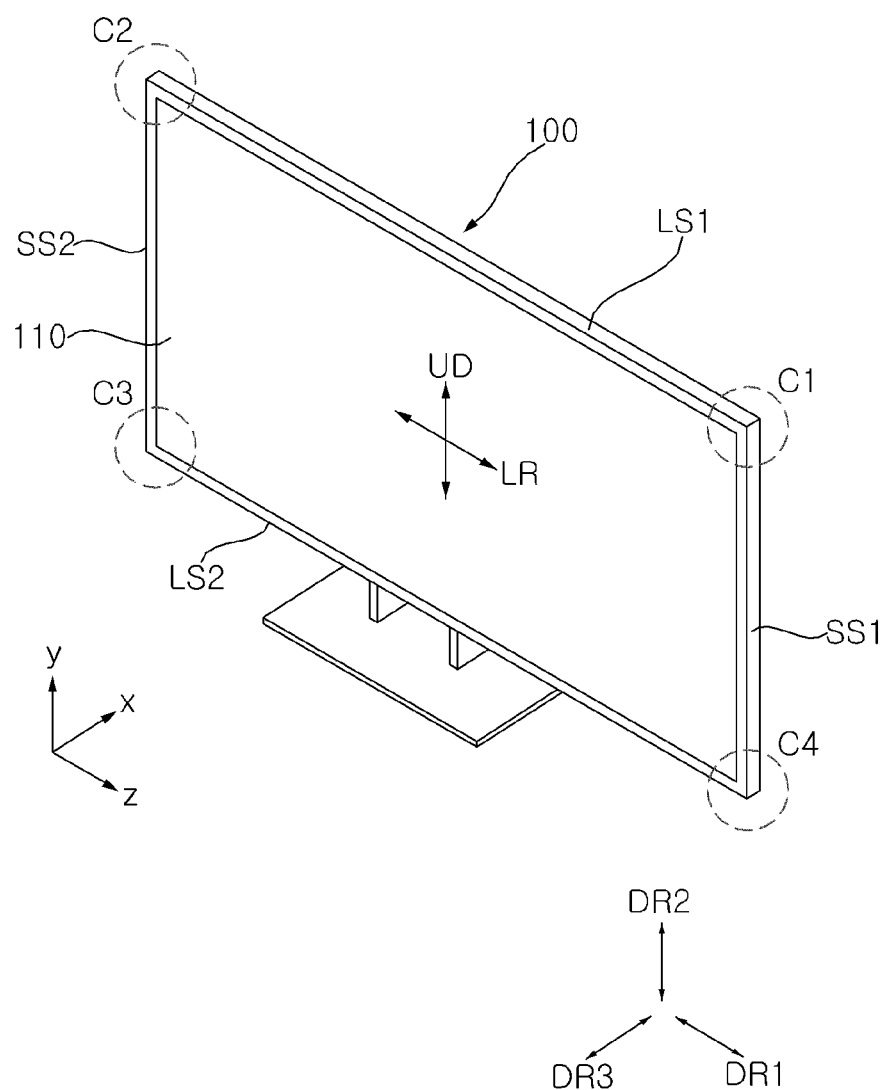
FIGS. 1 to 3 are diagrams illustrating examples of a display device according to embodiments of the present disclosure.

Referring to FIG. 1, a display device may include a first long side LS1, a second long side LS2 facing the first long side LS1, a first short side SS1 adjacent to the first long side LS1 and the second long side LS2, and a second short side SS2 facing the first short side SS1.

The first short side area SS1 may be referred to as a first side area, the second short side area SS2 may be referred to as a second side area facing the first side area, the first long side area LS1 may be referred to as a third side area which is adjacent to the first side area and the second side area and positioned between the first side area and the second side area, and the second long side area LS2 may be referred to as a fourth side area which is adjacent to the first side area and the second side area, positioned between the first side area and the second side area, and faces the third side area.

It is illustrated and described that the lengths of the first and second long sides LS1 and LS2 are longer than the lengths of the first and second short sides SS1 and SS2, but it may be possible that the lengths of the first and second long sides LS1 and LS2 are approximately the same as the lengths of the first and second short sides SS1 and SS2.

A first direction DR1 may be a direction parallel to the long side LS1, LS2 of the display panel 100, and a second direction DR2 may be a direction parallel to the short side SS1, SS2 of the display panel 100. A third direction DR3 may be a direction perpendicular to the first direction DR1 and/or the second direction DR2. The first direction DR1 and the second direction DR2 may be collectively referred to as a horizontal direction. In addition, the third direction DR3 may be referred to as a vertical direction.

A side on which a display device displays an image may be referred to as a forward direction or a front side or front surface. When a display device displays an image, the side from which an image cannot be observed may be referred to as a rearward direction or a rear side or rear surface.

When the display is viewed from a forward direction or the front side, the side of the first long side LS1 may be referred to as an upper side or an upper surface. Similarly, the side of the second long side LS2 may be referred to as a lower side or a lower surface. Similarly, the side of the first short side SS1 may be referred to as a right side or a right surface, and the side of the second short side SS2 may be referred to as a left side or a left surface.

The first long side LS1, the second long side LS2, the first short side SS1, and the second short side SS2 may be referred to as an edge of the display device 1. In addition, a point where the first long side LS1, the second long side LS2, the first short side SS1, and the second short side SS2 meet each other may be referred to as a corner. For example, a point where the first short side SS1 and the first long side LS1 meet may be referred to as a first corner C1. A point where the first long side LS1 and the second short side SS2 meet may be referred to as a second corner C2. A point where the second short side SS2 and the second long side LS2 meet may be referred to as a third corner C3. A point where the second long side LS2 and the first short side SS1 meet may be referred to as a fourth corner C4.

A direction from the first short side SS1 toward the second short side SS2 or a direction from the second short side SS2 toward the first short side SS1 may be referred to as a left-right direction LR. A direction from the first long side LS1 toward the second long side LS2 or a direction from the second long side LS2 toward the first long side LS1 may be referred to as a up-down direction UD.

Figure 2:
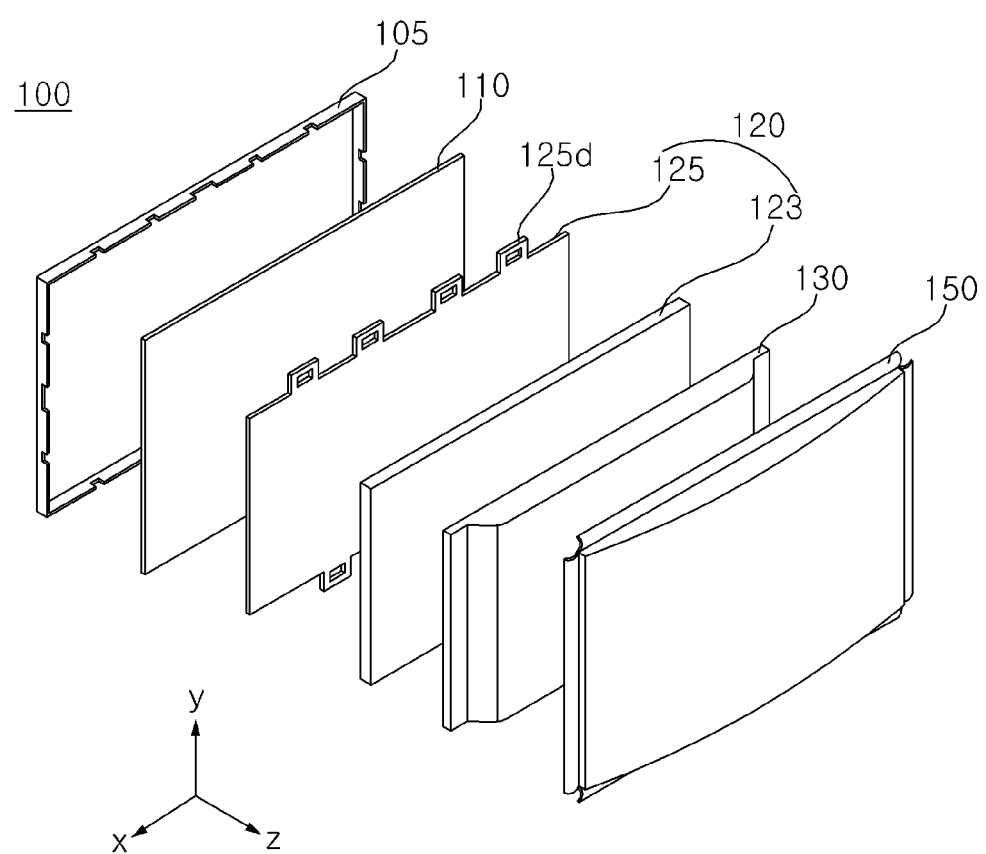

Referring to FIG. 2, a front cover 105 may cover at least portion of the front and side surfaces of a display panel 110. The front cover 105 may be divided into a front cover positioned on the front surface of the display panel 110 and a side cover positioned on the side surface of the display panel 110. Any one of the front cover and the side cover may be omitted.

The display panel 110 is provided in the front side of the display device 100 and may display an image. The display panel 110 may display an image by outputting red, green or blue (RGB) colors for each pixel of a plurality of pixels according to timing. The display panel 110 may be divided into an active area in which an image is displayed and a de-active area in which an image is not displayed. The display panel 110 may include a front substrate and a rear substrate facing each other with a liquid crystal layer interposed therebetween.

The front substrate may include a plurality of pixels including red R, green G, and blue B sub-pixels. The front substrate may output light corresponding to a color of red, green, or blue according to a control signal.

The rear substrate may include switching elements. The rear substrate may switch a pixel electrode. For example, the pixel electrode may change the molecular arrangement of the liquid crystal layer according to an externally applied control signal. The liquid crystal layer may include liquid crystal molecules. The liquid crystal molecules may change their arrangement in response to a voltage difference generated between the pixel electrode and a common electrode. The liquid crystal layer may transmit or block light provided from a backlight unit 120 to the front substrate.

A backlight unit 120 may be positioned in the rearward direction of the display panel 110. The backlight unit 120 may include light sources. The backlight unit 120 may be coupled to a frame 130 in the forward direction of the frame 130. The frame 130 may be referred to as a rear frame 130 or a main frame 130.

The backlight unit 120 may be driven by a full driving method or a partial driving method such as local dimming and impulsive. The backlight unit 120 may include an optical sheet 125 and an optical layer 123. The optical layer 123 may be referred to as an optical module 123 or an optical unit 123.

The optical sheet 125 may allow the light of the light source to be evenly transmitted to the display panel 110. The optical sheet 125 may include a plurality of layers. For example, the optical sheet 125 may include a prism sheet, a diffusion sheet, or the like.

The optical sheet 125 may include a coupling portion 125d. The coupling portion 125d may be coupled to the front cover 105, the frame 130, and/or a back cover 150. Alternatively, the coupling portion 125d may be coupled to a structure formed on or coupled to the front cover 105, the frame 130, and/or the back cover 150.

The frame 130 may serve to support components of the display device 100. For example, a component such as the backlight unit 120 may be coupled to the frame 130. The frame 130 may be made of a metal material such as an aluminum alloy.

The back cover 150 may be positioned in the rear side or the rearward direction of the display device 100. The back cover 150 may be coupled to the frame 130 and/or the front cover 105. For example, the back cover 150 may be an injection molding made of a resin material.

Figure 3:
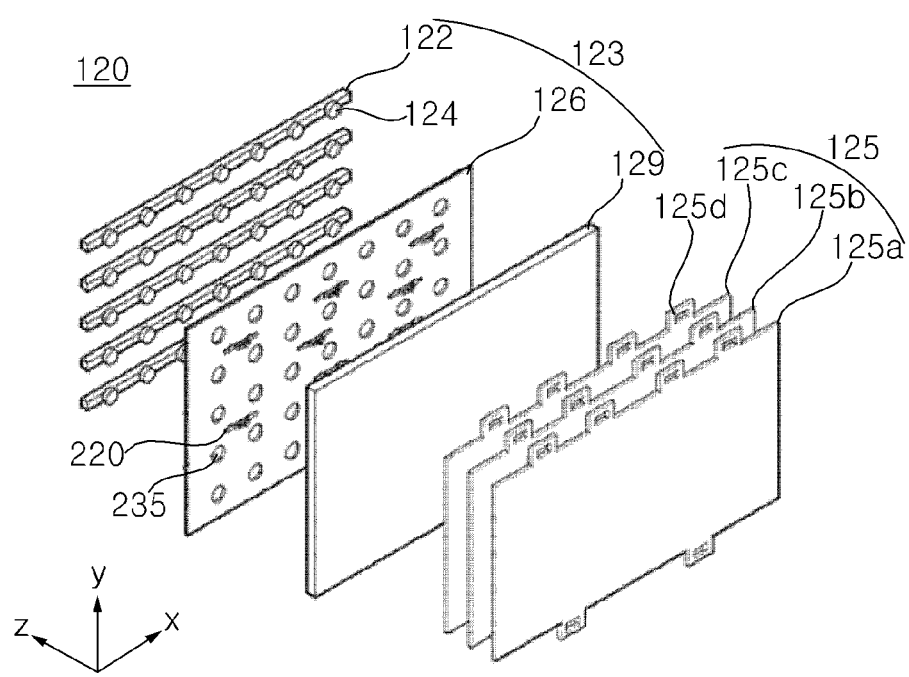

Referring to FIG. 3, a substrate 122 may be configured in the form of a plurality of straps that extend in a first direction and are spaced apart from each other by a certain distance in a second direction orthogonal to the first direction.

At least one optical assembly 124 may be mounted on the substrate 122. An electrode pattern for connecting an adapter and the optical assembly 124 may be formed on the substrate 122. For example, a carbon nanotube electrode pattern for connecting the optical assembly 124 and the adapter may be formed on the substrate 122.

The substrate 122 may be formed of at least one of polyethylene terephthalate (PET), glass, polycarbonate (PC), and silicon. The substrate 122 may be a printed circuit board (PCB) on which at least one optical assembly 124 is mounted.

The optical assembly 124 may be disposed on the substrate 122 with a certain interval in a first direction. A diameter of the optical assembly 124 may be greater than a width of the substrate 122. That is, it may be greater than the length of the substrate 122 in a second direction.

The optical assembly 124 may be a light emitting diode (LED) chip or a light emitting diode package including at least one light emitting diode chip.

The optical assembly 124 may include a light source. The light source may be a colored LED or a white LED that emits at least one color among colors such as red, blue, and green. The colored LED may be a blue LED. For example, the light source may be a mini LED.

A reflective sheet 126 may be positioned in the front side of the substrate 122. The reflective sheet 126 may be positioned in an area of the substrate 122 excluding an area where the optical assembly 124 is formed. The reflective sheet 126 may have a plurality of holes 235.

The reflective sheet 126 may reflect the light emitted from the optical assembly 124 toward the front side. In addition, the reflective sheet 126 may recycle light emitted from the optical assembly 124.

The reflective sheet 126 may include at least one of metal and metal oxide which are reflective material. For example, the reflective sheet 126 may include a metal and/or a metal oxide having a high reflectance such as at least one of aluminum Al, silver Ag, gold Au, and titanium dioxide TiO2.

A resin may be deposited or coated on the optical assembly 124 and/or the reflective sheet 126. The resin may serve to diffuse light emitted from the optical assembly 124.

An optical layer 129 may include a phosphor. The optical layer 129 may be formed of a plate or a thin sheet. The optical layer 129 may include a red-based phosphor and/or a green-based phosphor. The optical layer 129 may change a wavelength or color of light provided from the optical assembly 124. For example, when the optical assembly 124 provides blue-based light, the optical layer 129 may convert the blue-based light into white light. The optical layer 129 may be referred to as a QD layer or a QD sheet.

The optical sheet 125 may be positioned in the forward direction of the optical layer 129. The rear surface of the optical sheet 125 may be in close contact with the optical layer 129, and the front surface of the optical sheet 125 may be in close contact with or adjacent to the rear surface of the display panel 110.

The optical sheet 125 may include at least one sheet. Specifically, the optical sheet 125 may include one or more prism sheets and/or one or more diffusion sheets. A plurality of sheets included in the optical sheet 125 may be in an adhesive and/or closely adhered state.

The optical sheet 125 may be configured of a plurality of sheets having different functions. For example, the optical sheet 125 may include first to third optical sheets 125a to 125c. For example, the first optical sheet 125a may be a diffusion sheet, and the second and third optical sheets 125b and 125c may be a prism sheet. The number and/or position of the diffusion sheet 125a and the prism sheet 125b, 125c may be changed.

The diffusion sheet 125a may prevent the light emitted from the optical layer 129 from being partially concentrated, thereby making light distribution more uniform. The prism sheet 125b, 125c may collect light emitted from the diffusion sheet 125a to provide light to the display panel 110.

The coupling portion 125d may be formed in at least one of sides or edges of the optical sheet 125. The coupling portion 125d may be formed in at least one of the first to third optical sheets 125a to 125c.

The coupling portion 125d may be formed in the long side of the optical sheet 125. The coupling portion 125d formed in the first long side and the coupling portion 125d formed in the second long side may be asymmetric. For example, the positions and/or the numbers of the coupling portion 125d in the first long side and the coupling portion 125d in the second long side may be different from each other.

Figure 4:
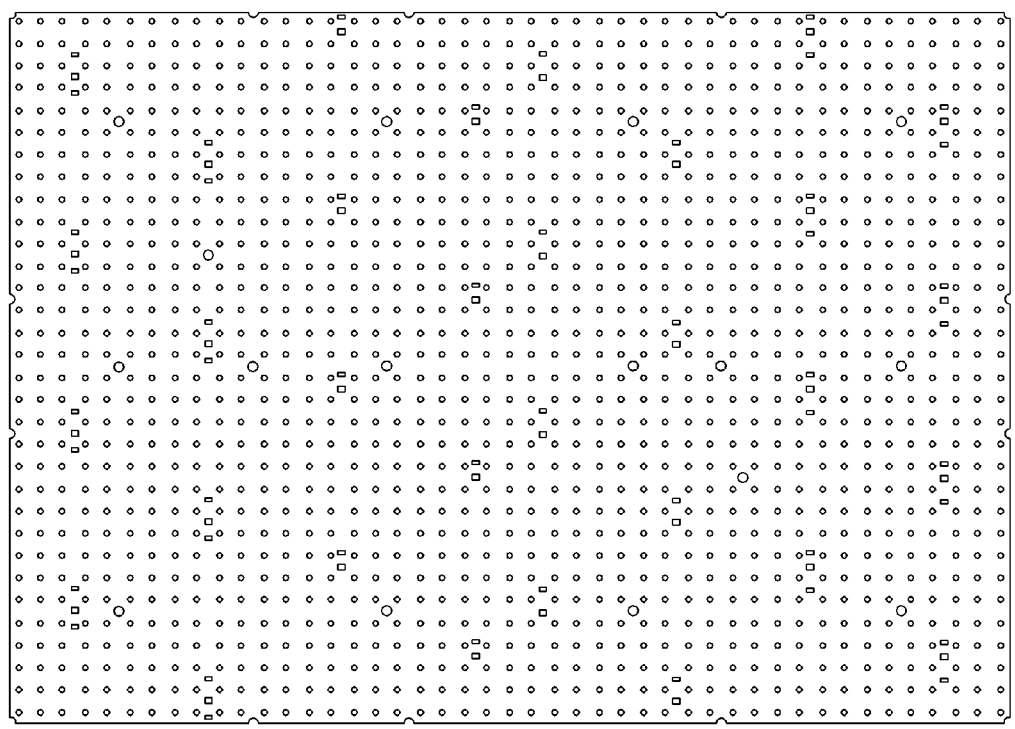
FIGS. 4 to 6 are diagrams illustrating examples of a substrate and an optical assembly for providing light to a display device according to embodiments of the present disclosure.
Figure 5:
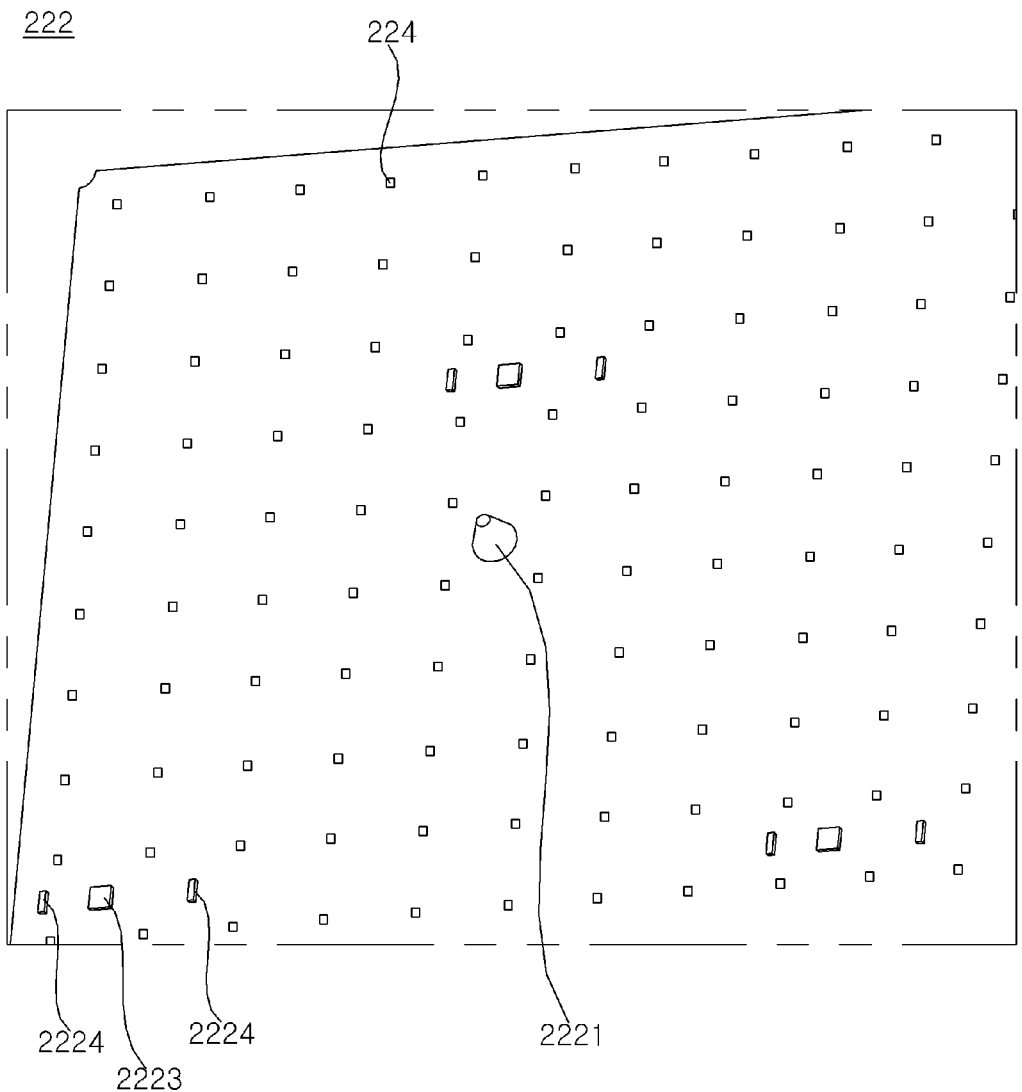

Referring to FIGS. 4 and 5, a substrate 222 may be a plate. The front surface of the substrate 222 may be white. A white or reflective material may be applied to the front surface of the substrate 222. An optical assembly 224 may be mounted on the substrate 222. The optical assembly 224 may include a light source and a mini-lens. For example, the light source may be a mini LED that provides blue light. A plurality of light sources may be mounted on the substrate 222. The plurality of light sources may be disposed to form a plurality of rows and a plurality of columns.

An integrated device 2223 and a capacitor 2224 may be disposed around a light source 224. For example, the integrated device 2223 may be an IC chip 2223. A plurality of capacitors 2224 may face the integrated device 2223. The integrated device 2223 may control power provided to a certain number of a plurality of light sources 224.

A supporter 2221 may be mounted on the substrate 222. The supporter 2221 may uniformly maintain a distance between the substrate 222 and the aforementioned optical layer 129. The supporter 2221 may have a conical shape as a whole. The supporter 2221 may be formed by double injection, and may be bonded to the substrate 222. The supporter 2221 may be positioned between the optical assemblies 224, and may be fixed on the substrate 222.

Figure 6:
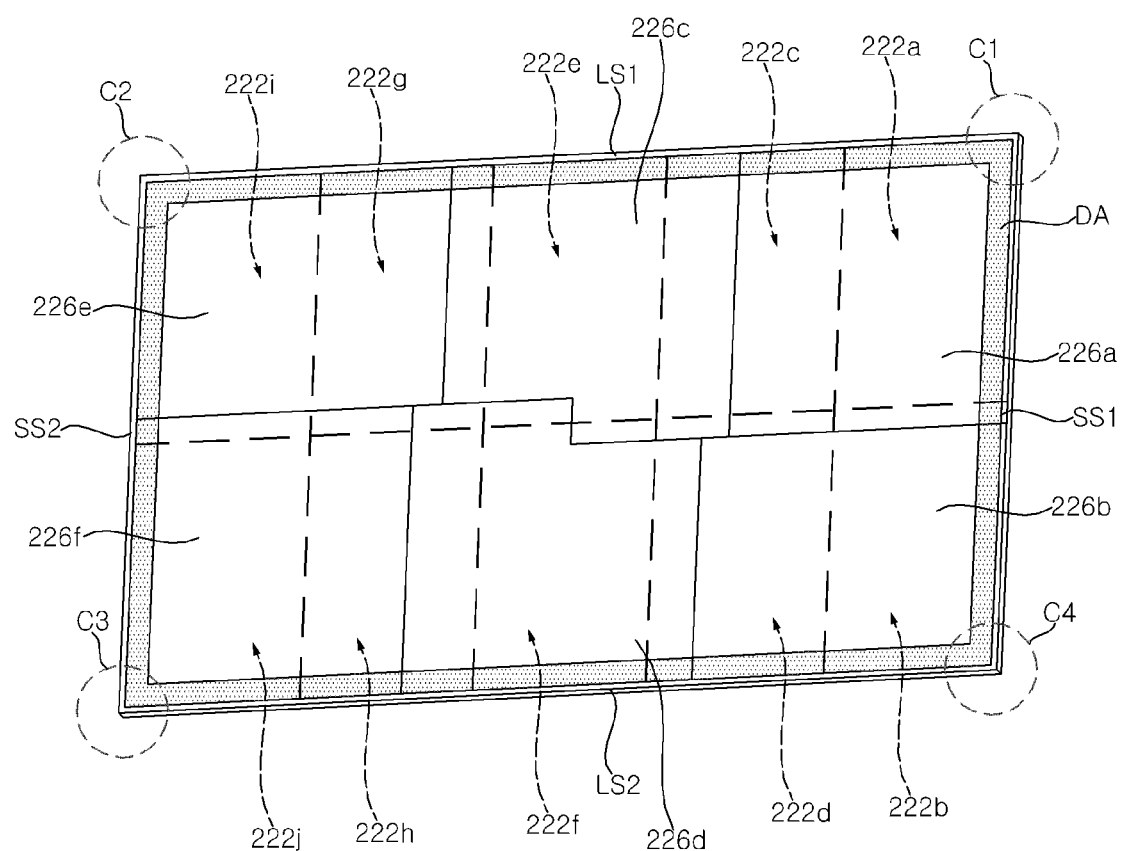

Referring to FIG. 6, there may be a plurality of substrates 222. The plurality of substrates 222 may include a first substrate 222a, a second substrate 222b, a third substrate 222c, a fourth substrate 222d, a fifth substrate 222e, a sixth substrate 222f, a seventh substrate 222g, an eighth substrate 222h, a ninth substrate 222i, and a tenth substrate 222j.

The first substrate 222a may be positioned in contact with the first long side LS1 and the first short side SS1, and may form a first corner C1. The second substrate 222b may be positioned in contact with the first short side SS1 and the second long side LS2, and may form a fourth corner C4. The second substrate 222b may be adjacent to the first substrate 222a in the up-down direction.

The ninth substrate 222i may be positioned in contact with the first long side LS1 and the second short side SS2, and may form a second corner C2. The tenth substrate 222j may be positioned in contact with the second short side SS2 and the second long side LS2, and may form a third corner C3. The tenth substrate 222j may be adjacent to the ninth substrate 222i in the up-down direction.

The fifth substrate 222e may be in contact with the first long side LS1 and may be positioned between the first substrate 222a and the ninth substrate 222i. The sixth substrate 222f may be in contact with the second long side LS2 and may be positioned between the second substrate 222d and the tenth substrate 222j. The sixth substrate 222f may be adjacent to the fifth substrate 222e in the up-down direction.

The third substrate 222c may be in contact with the first long side LS1 and may be positioned between the first substrate 222a and the fifth substrate 222e. The fourth substrate 222d may be in contact with the second long side LS2 and may be positioned between the second substrate 222b and the sixth substrate 222f. The fourth substrate 222d may be adjacent to the third substrate 222c in the up-down direction.

The seventh substrate 222g may be in contact with the first long side LS1 and may be positioned between the fifth substrate 222e and the ninth substrate 222i. The eighth substrate 222h may be in contact with the second long side LS2 and may be positioned between the sixth substrate 222f and the tenth substrate 222j. The eighth substrate 222h may be adjacent to the seventh substrate 222g in the up-down direction.

A reflective sheet 226 may cover the substrate 222. The reflective sheet 226 may be plural. The plurality of reflective sheets 226 may cover the plurality of substrates 222. The plurality of reflective sheets 226 may include a first reflective sheet 226a, a second reflective sheet 226b, a third reflective sheet 226c, a fourth reflective sheet 226d, a fifth reflective sheet 226e, and a sixth reflective sheet 226f.

The first reflective sheet 226a may cover the first substrate 222a. The first reflective sheet 226a may overlap the second substrate 222b, the third substrate 222c, and the fourth substrate 222d. The second reflective sheet 226b may cover at least a part or most of the second substrate 222b, and may overlap the fourth substrate 222d.

The third reflective sheet 226c may cover at least a part or most of the fifth substrate 222e. The third reflective sheet 226c may overlap the third substrate 222c, the fourth substrate 222d, the sixth substrate 222f, and the seventh substrate 222g. The fourth reflective sheet 226d may cover at least a part or most of the sixth substrate 222f. The fourth reflective sheet 226d may overlap the fourth substrate 222d, the fifth substrate 222e, the sixth substrate 222f, and the seventh substrate 222g.

The fifth reflective sheet 226e may cover at least a part or most of the ninth substrate 222i, and may overlap the seventh substrate 222g. The sixth reflective sheet 226f may cover the tenth substrate 222j. The sixth reflective sheet 226f may overlap the seventh substrate 222g, the eighth substrate 222h, and the ninth substrate 222i.

An area DA, a dot area DA, or a pattern area DA may be formed along the first long side LS1, the second long side LS2, the first short side SS1, and/or the second short side SS2.

Figure 7:
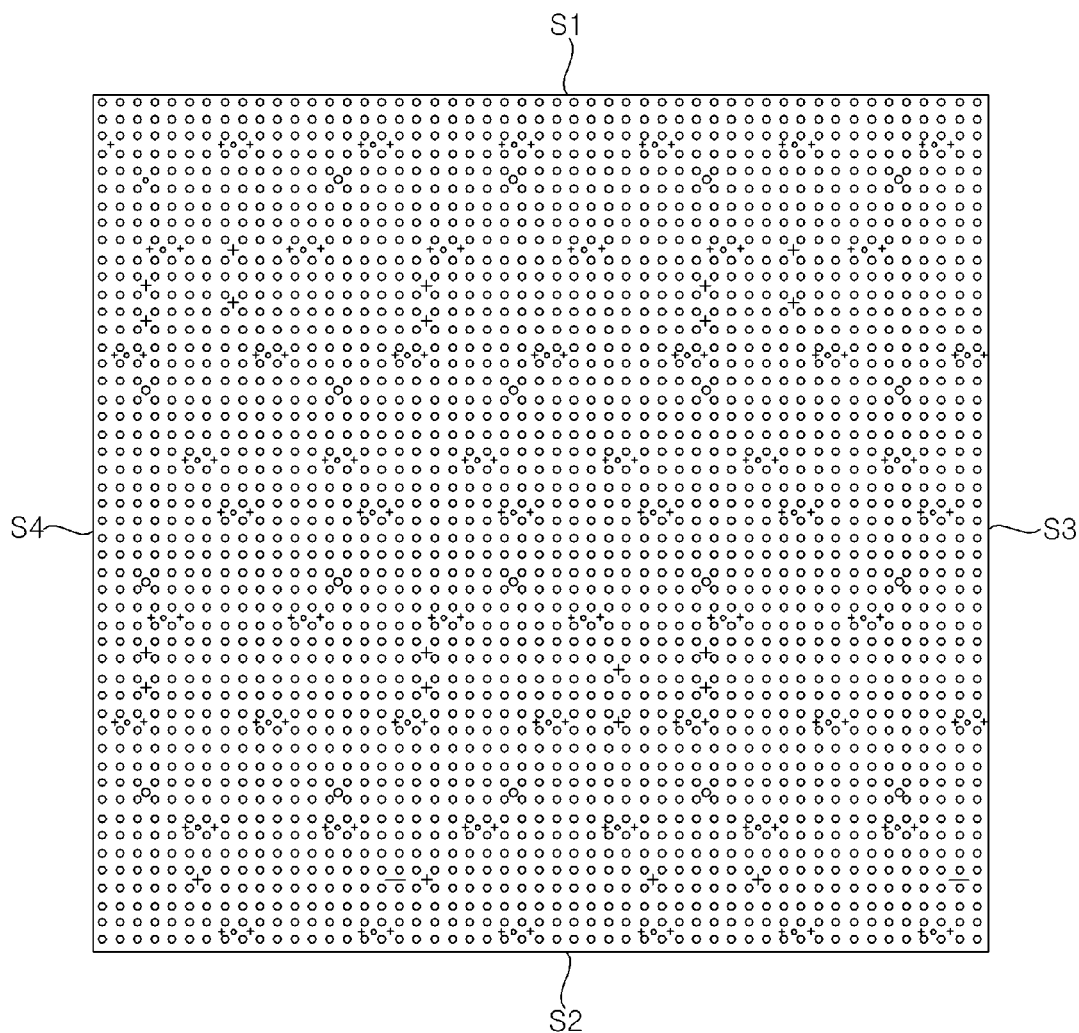
FIGS. 7 to 16 are diagrams illustrating examples of a reflective sheet according to embodiments of the present disclosure.
Figure 8:
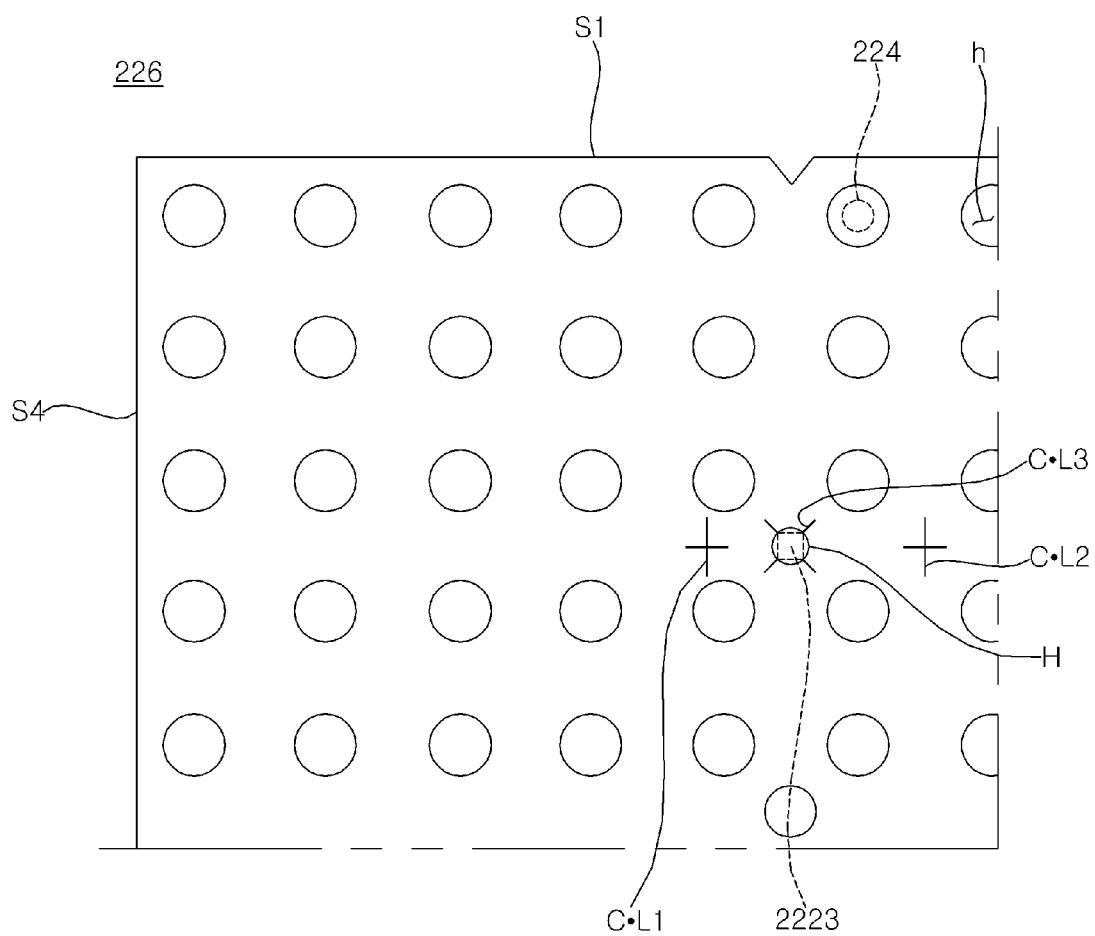

Referring to FIGS. 7 and 8, the reflective sheet 226 may include a first side S1, a second side S2, a third side S3, and a fourth side S4. A side S may be referred to as an edge S.

The reflective sheet 226 may include a plurality of holes h and a plurality of cut-lines CL. The plurality of holes h may be formed to correspond to the light sources 224 or the optical assemblies 224. An area of the hole h may be larger than a cross-sectional area of the optical assembly 224.

The reflective sheet 226 may have an accommodation hole H. A cut-line CL3 may be formed around the accommodation hole H. The cut-line CL3 may be formed in the radial direction of the accommodation hole H. For example, the cut-line CL3 may have a + shape. The accommodation hole H may be referred to as a cut-line hole H. The integrated device 2223 may be positioned in the accommodation hole H. The area of the accommodation hole H may be larger than the cross-sectional area of the integrated device 2223. For example, the accommodation hole H may have a circular shape, and the integrated device 2223 may have a rectangular shape. A portion of the integrated device 2223 may overlap the accommodation hole H, and the cut-line CL3 around the accommodation hole H may be opened.

The reflective sheet 226 may include a cut-line CL. For example, the cut-line CL may have a + shape. The cut-line CL1, CL2 may be positioned between the holes h, and may be positioned adjacent to the accommodation hole H. A first cut-line CL1 may be positioned between the holes h, and adjacent to the accommodation hole H. A second cut-line CL2 may face the first cut-line CL1 with respect to the accommodation hole H. The accommodation hole H may be positioned between the first cut-line CL1 and the second cut-line CL2. Capacitors 2224 (see FIG. 5) adjacent to the integrated device 2223 may be positioned below the cut-lines CL1 and CL2, and the cut-lines CL1 and CL2 may be spaced apart.

Accordingly, the reflective sheet 226 may be prevented from being spaced apart from the substrate 222, and light uniformity may be improved.

Figure 9:
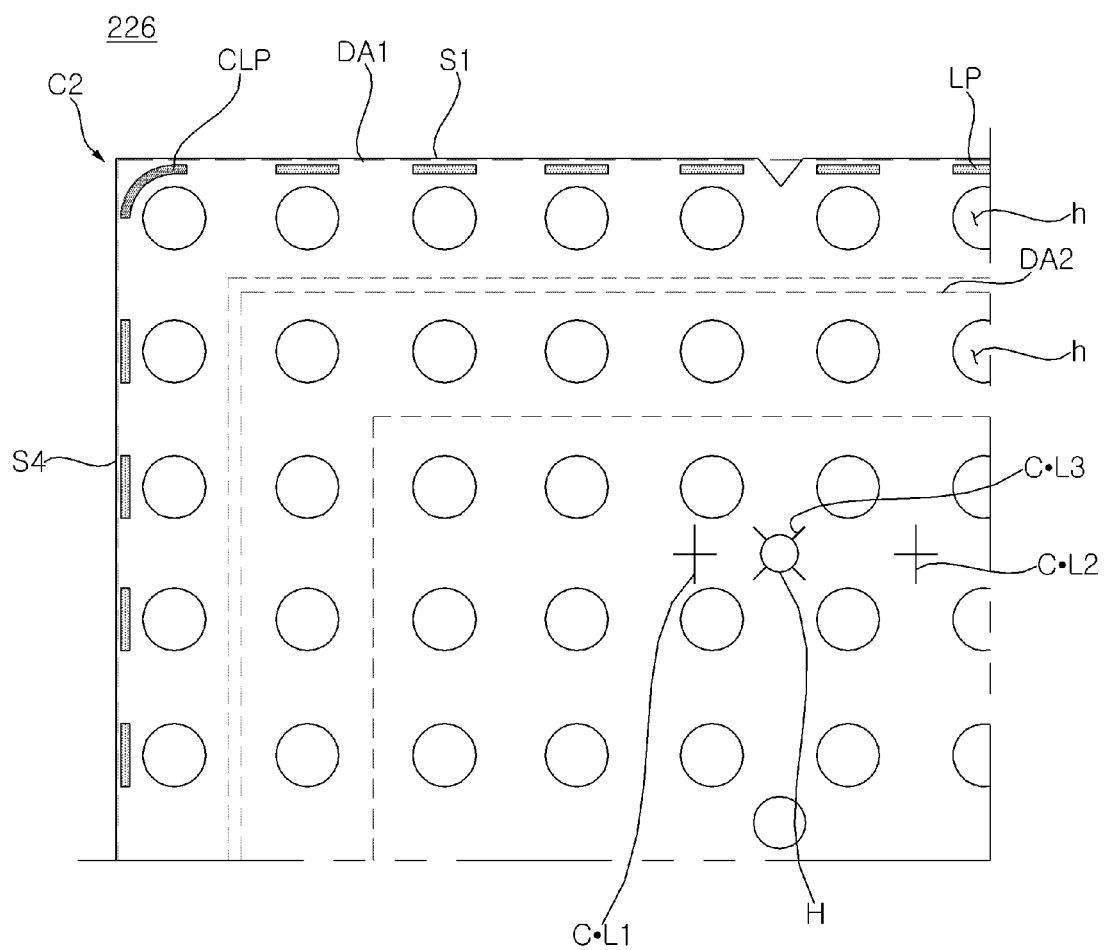

Referring to FIG. 9, the reflective sheet 226 may include a first area DA1 and a second area DA2. The first area DA1 may be referred to as a first dot area DA1 or a first pattern area DA1, and the second area DA2 may be referred to as a second dot area DA2 or a second pattern area DA2.

The first area DA1 may be formed to extend long along the first side S1 and/or the fourth side S4. A first plurality of holes h may be sequentially formed in the first area DA1 while maintaining a certain interval. The first area DA1 may be in contact with the first side S1 and/or the fourth side S4. The description of the first side S1 and/or the fourth side S4 may be applied to other sides S2 and S3.

The second area DA2 may be formed to extend long along the first side S1 and/or the fourth side S4. A second plurality of holes h may be sequentially formed in the second area DA2 while maintaining a certain interval. The second area DA2 may be in contact with or adjacent to the first area DA1. The distance of the second area DA2 from the first side S1 and/or the second side S2 is greater than the distance of the first area DA1 from the first side S1 and/or the fourth side S4. The first area DA1 may be positioned between the second area DA2 and the first side S1 and/or the fourth side S4.

An optical pattern LP, CLP may include a phosphor. The optical pattern LP, CLP may include a red-based phosphor and a green-based phosphor. The optical pattern LP, CLP may include a yellow-based phosphor.

For example, the optical pattern LP, CLP may have a yellow-based color with the naked eye. The optical pattern LP, CLP may convert blue-based light provided by the light source 224 (see FIG. 5) or the optical assembly 224 into white light.

For another example, the optical pattern LP, CLP may have a black or gray-based color with the naked eye. The optical pattern LP, CLP may absorb light provided by the light source 224 (see FIG. 5) or the optical assembly 224.

The optical pattern LP, CLP may be formed in the first area DA1. The optical pattern LP, CLP may be formed between the plurality of first holes h and the first side S1 and/or the fourth side S4. The optical pattern LP, CLP may include a plurality of segments LP and CLP. The plurality of segments LP may be an elongated line. Each of the plurality of lines LP may be positioned to correspond to each of the plurality of holes h. For example, the length of the line LP may correspond to the diameter of the hole h. As another example, the length of the line LP may be smaller than the diameter of the hole h. As another example, the length of the line LP may be greater than the diameter of the hole h.

A corner line CLP may extend while being bent or may have a fan-shape or semicircular shape. For example, the corner line CLP may be a quarter circle. The corner line CLP may be positioned between the hole h closest to the second corner C2 and the second corner C2. The description of the second corner C2 may be applied to other corners C1, C3, and C4.

Figure 10:
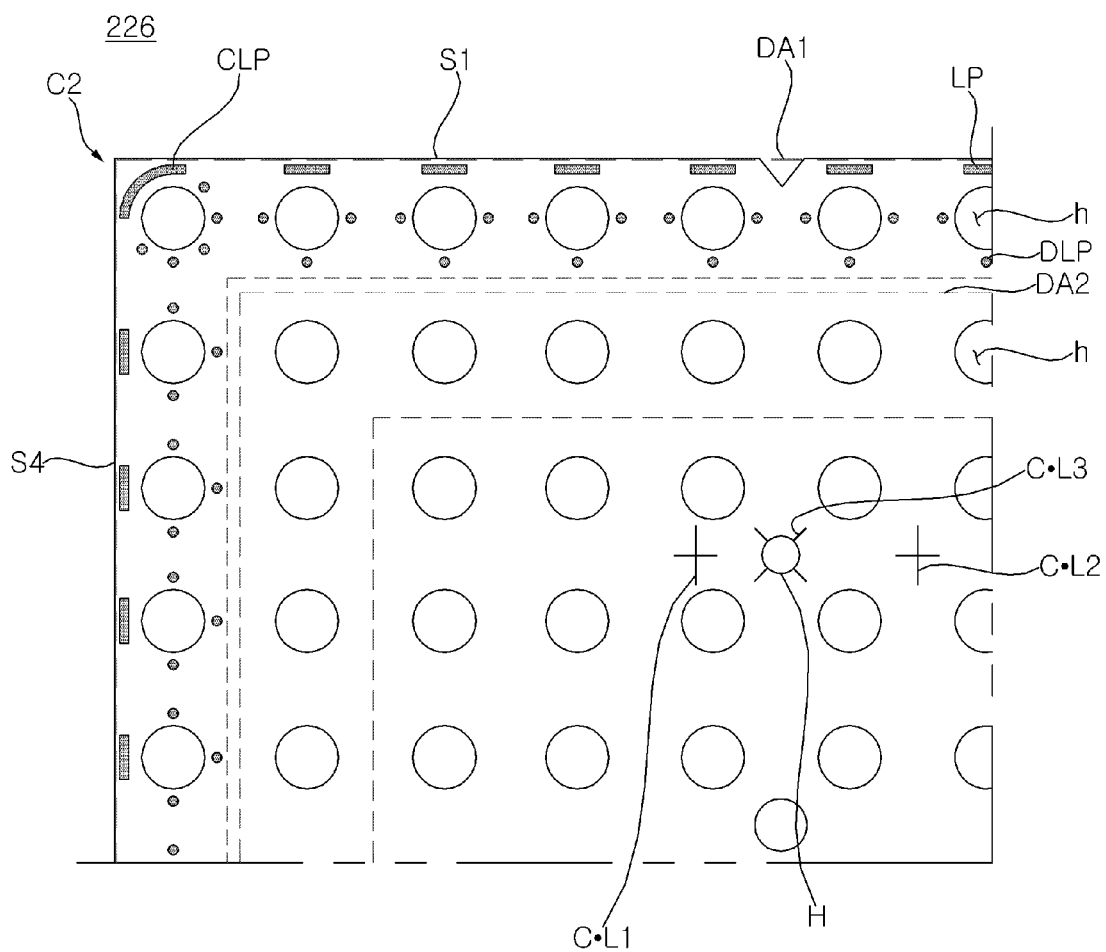

Referring to FIG. 10, the reflective sheet 226 may include a first area DA1 and a second area DA2. The first area DA1 may be referred to as a first dot area DA1 or a first pattern area DA1, and the second area DA2 may be referred to as a second dot area DA2 or a second pattern area DA2.

The first area DA1 may be formed to extend long along the first side S1 and/or the fourth side S4. A first plurality of holes h may be sequentially formed in the first area DA1 while maintaining a certain interval. The first area DA1 may be in contact with the first side S1 and/or the fourth side S4. The description of the first side S1 and/or the fourth side S4 may be applied to other sides S2 and S3.

The second area DA2 may be formed to extend long along the first side S1 and/or the fourth side S4. A second plurality of holes h may be sequentially formed in the second area DA2 while maintaining a certain interval. The second area DA2 may be in contact with or adjacent to the first area DA1. The distance of the second area DA2 from the first side S1 and/or the second side S2 is greater than the distance of the first area DA1 from the first side S1 and/or the fourth side S4. The first area DA1 may be positioned between the second area DA2 and the first side S1 and/or the fourth side S4.

An optical pattern LP, CLP, DLP may include a phosphor. The optical pattern LP, CLP, DLP may include a red-based phosphor and a green-based phosphor. The optical pattern LP, CLP, DLP may include a yellow-based phosphor.

For example, the optical pattern LP, CLP, DLP may have a yellow-based color with the naked eye. The optical pattern LP, CLP, DLP may convert blue-based light provided by the light source 224 (see FIG. 5) or the optical assembly 224 into white light.

For another example, the optical pattern LP, CLP, DLP may have a black or gray-based color with the naked eye. The optical pattern LP, CLP, DLP may absorb light provided by the light source 224 (see FIG. 5) or the optical assembly 224.

The optical pattern LP, CLP, DLP may be formed in the first area DAL The optical pattern LP, CLP may be formed between the plurality of first holes h and the first side S1 and/or the fourth side S4.

The optical pattern LP may include a plurality of segments LP. The plurality of segments LP may be an elongated line. Each of the plurality of lines LP may be positioned to correspond to each of the plurality of holes h. For example, the length of the line LP may correspond to the diameter of the hole h. As another example, the length of the line LP may be smaller than the diameter of the hole h. As another example, the length of the line LP may be greater than the diameter of the hole h.

The optical pattern DLP may include a dot DLP. The dots DLP may be disposed around the hole h. For example, the number of dots DLP may be three. The line LP and the dot DLP may be disposed while surrounding the hole h. Two dots DLP may face each other with respect to the hole h, and one dot DLP may face the line LP with respect to the hole h.

The optical pattern CLP may include a corner line CLP. The corner line CLP may extend while being bent or may have a fan-shape or semicircular shape. For example, the corner line CLP may be a quarter circle. The corner line CLP may be positioned between the hole h closest to the second corner C2 and the second corner C2. The corner line CLP may be referred to as a curved line CLP. The dots DLP may be disposed around the hole h closest to the second corner C2. For example, the number of dots DLP may be five. The five dots DLP may be sequentially disposed around the hole h closest to the second corner C2 together with the corner line CLP. The dots DLP may face the corner line CLP with respect to the hole h. The description of the second corner C2 may be applied to other corners C1, C3, and C4.

Figure 11:
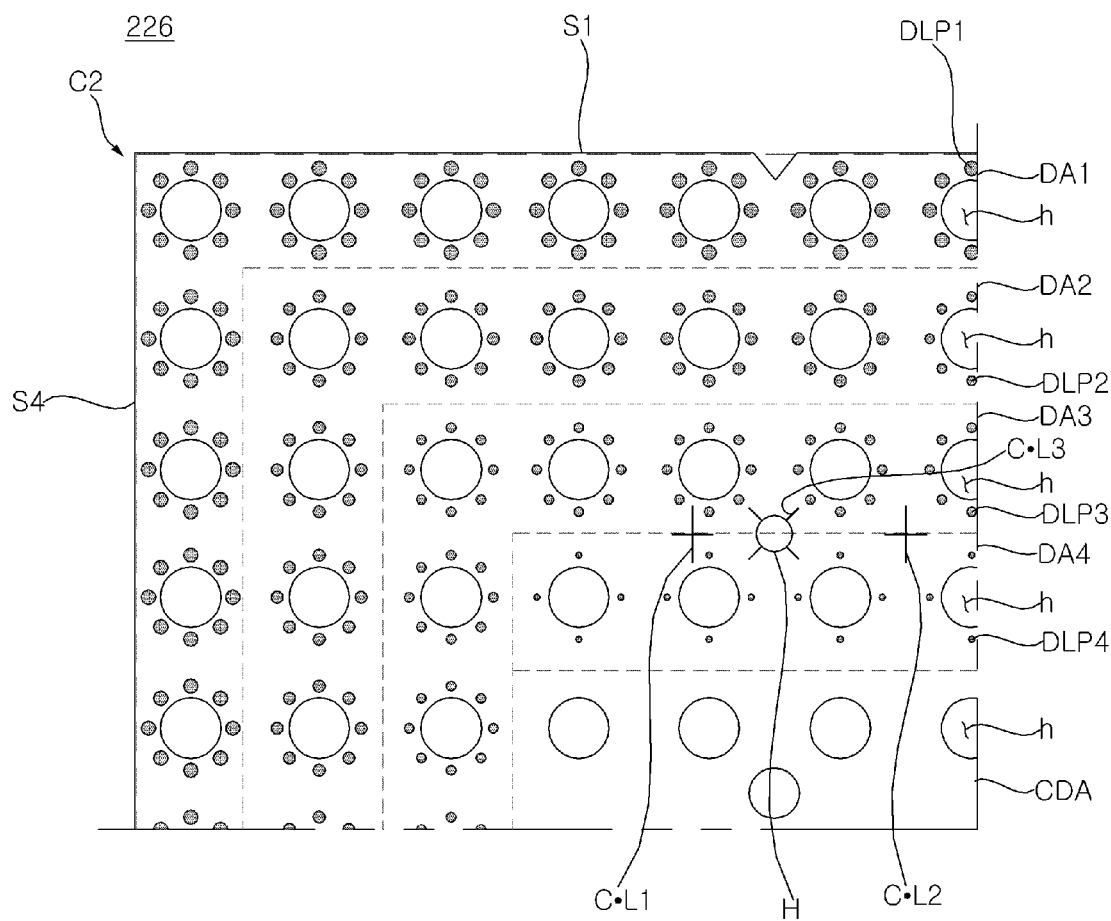

Referring to FIG. 11, the reflective sheet 226 may include a first area DA1, a second area DA2, a third area DA3, a fourth area DA4, and a central area CDA. The area DA may be referred to as a dot area DA.

The first area DA1 may be formed to extend long along the first side S1 and/or the fourth side S4. A first plurality of holes h may be sequentially formed in the first area DA1 while maintaining a certain interval. The first area DA1 may be in contact with the first side S1 and/or the fourth side S4. The description of the first side S1 and/or the fourth side S4 may be applied to other sides S2 and S3.

The second area DA2 may be formed to extend long along the first side S1 and/or the fourth side S4. A second plurality of holes h may be sequentially formed in the second area DA2 while maintaining a certain interval. The second area DA2 may be in contact with or adjacent to the first area DA1. The distance of the second area DA2 from the first side S1 and/or the fourth side S4 may be greater than the distance of the first area DA1 from the first side S1 and/or the fourth side S4. The first area DA1 may be positioned between the second area DA2 and the first side S1 and/or the fourth side S4.

The third area DA3 may be formed to extend long along the first side S1 and/or the fourth side S4. A third plurality of holes h may be sequentially formed in the third area DA3 while maintaining a certain interval. The third area DA3 may be in contact with or adjacent to the second area DA2. The distance of the third area DA3 from the first side S1 and/or the fourth side S4 may be greater than the distance of the second area DA2 from the first side S1 and/or the fourth side S4. The second area DA2 may be positioned between the third area DA3 and the first area DA1.

The fourth area DA4 may be formed to be long along the first side S1. A fourth plurality of holes h may be sequentially formed in the fourth area DA4 while maintaining a certain interval. The fourth area DA4 may be in contact with or adjacent to the third area DA3. The distance of the fourth area DA4 from the first side S1 and/or the fourth side S4 may be greater than the distance of the third area DA3 from the first side S1 and/or the fourth side S4. The third area DA3 may be positioned between the fourth area DA4 and the second area DA2.

The central area CDA may be an area of the reflective sheet 226 excluding the first area DA1, the second area DA2, the third area DA3, and the fourth area DA4.

The optical pattern DLP may include a phosphor. The optical pattern DLP may include a red-based phosphor and a green-based phosphor. The optical pattern DLP may include a yellow-based phosphor.

For example, the optical pattern DLP may have a yellow-based color with the naked eye. The optical pattern DLP may convert blue-based light provided by the light source 224 (see FIG. 5) or the optical assembly 224 into white light.

For another example, the optical pattern DLP may have a black or gray-based color with the naked eye. The optical pattern DLP may absorb light provided by the light source 224 (see FIG. 5) or the optical assembly 224.

The optical pattern DLP may include dots DLP. The dots DLP may be disposed around the hole h. The dots DLP may be disposed while surrounding the hole h.

The first dots DLP1 may be disposed around at least one of the first plurality of holes h. For example, the number of the first dots DLP1 may be eight, and the eight first dots DLP1 may be sequentially positioned around the hole h while maintaining a certain interval.

The second dots DLP2 may be disposed around at least one of the second plurality of holes h. For example, the number of the second dots DLP2 may be eight, and the eight second dots DLP2 may be sequentially positioned around the hole h while maintaining a certain interval.

The third dots DLP3 may be disposed around at least one of the plurality of third holes h. For example, the number of third dots DLP3 may be eight, and the eight third dots DLP3 may be sequentially positioned around the hole h while maintaining a certain interval.

The fourth dots DLP4 may be disposed around at least one of the plurality of fourth holes h. For example, the number of fourth dots DLP4 may be three or four, and the four fourth dots DLP4 may be sequentially positioned around the hole h while maintaining a certain interval. The number of dots DLP4 around the hole h adjacent to the cut-line CL1 may be three. A dot DLP4 may be disposed in an area adjacent to the cut-line CL1 around the hole h.

For example, the size of the first dot DLP1 may be larger than the size of the second dot DLP2. The size of the second dot DLP2 may be larger than the size of the third dot DLP3. The size of the third dot DLP3 may be larger than the size of the fourth dot DLP4. As another example, the sizes of the first dot DLP1, the second dot DLP2, the third dot DLP3, and the fourth dot DLP4 may be the same. When the sizes of the dots DLP are the same, the number of dots DLP may increase.

The description of the second corner C2 may be applied to other corners C1, C3, and C4.

Figure 12:
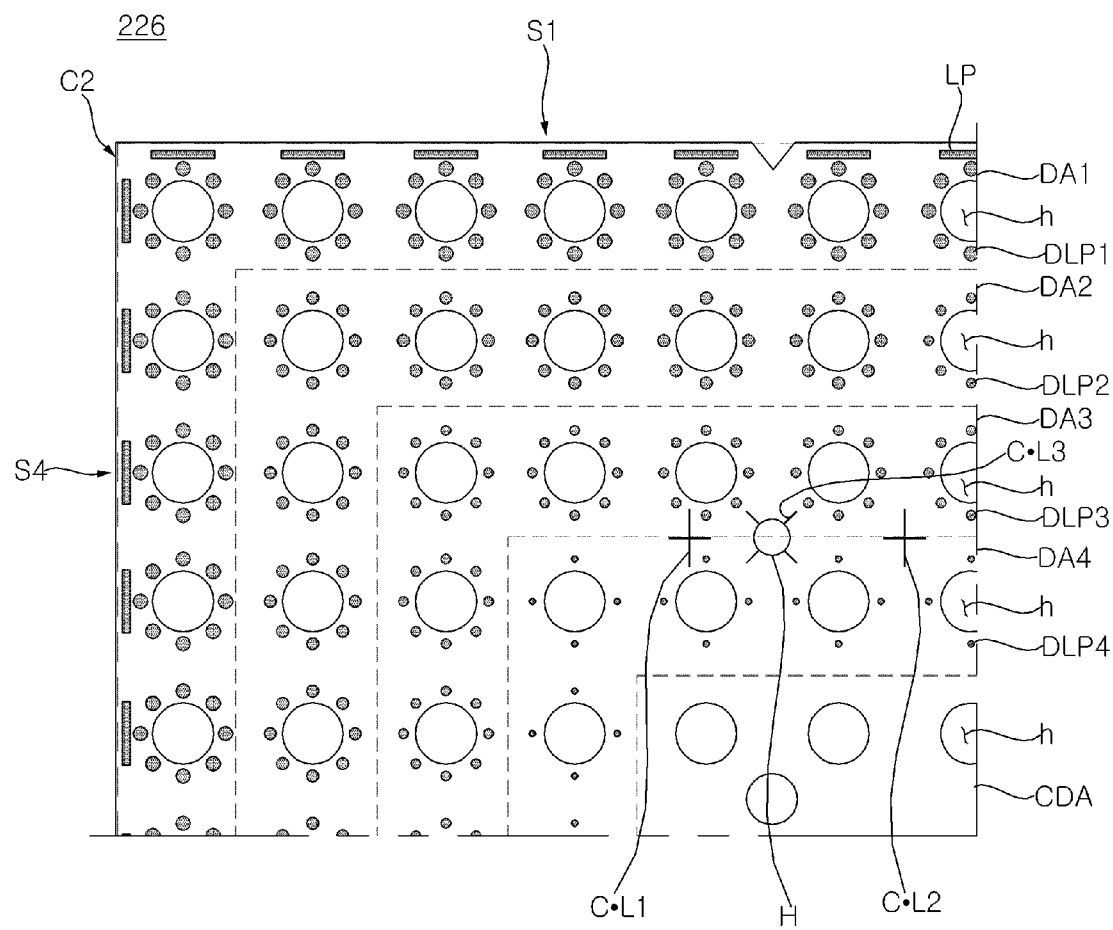

Referring to FIG. 12, the reflective sheet 226 may include a first area DA1, a second area DA2, a third area DA3, a fourth area DA4, and a central area CDA. The area DA may be referred to as a dot area DA or a pattern area DA.

The first area DA1 may be formed to extend long along the first side S1 and/or the fourth side S4. The first plurality of holes h may be sequentially formed in the first area DA1 while maintaining a certain interval. The first area DA1 may be in contact with the first side S1 and/or the fourth side S4. The description of the first side S1 and/or the fourth side S4 may be applied to other sides S2 and S3.

The second area DA2 may be formed to extend long along the first side S1 and/or the fourth side S4. The second plurality of holes h may be sequentially formed in the second area DA2 while maintaining a certain interval. The second area DA2 may be in contact with or adjacent to the first area DA1. The distance of the second area DA2 from the first side S1 and/or the fourth side S4 may be greater than the distance of the first area DA1 from the first side S1 and/or the fourth side S4. The first area DA1 may be positioned between the second area DA2 and the first side S1 and/or the fourth side S4.

The third area DA3 may be formed to extend long along the first side S1 and/or the fourth side S4. The third plurality of holes h may be sequentially formed in the third area DA3 while maintaining a certain interval. The third area DA3 may be in contact with or adjacent to the second area DA2. The distance of the third area DA3 from the first side S1 and/or the fourth side S4 may be greater than the distance of the second area DA2 from the first side S1 and/or the fourth side S4. The second area DA2 may be positioned between the third area DA3 and the first area DA1.

The fourth area DA4 may be formed to extend long along the first side S1 and/or the fourth side S4. A fourth plurality of holes h may be sequentially formed in the fourth area DA4 while maintaining a certain interval. The fourth area DA4 may be in contact with or adjacent to the third area DA3. The distance of the fourth area DA4 from the first side S1 and/or the fourth side S4 may be greater than the distance of the third area DA3 from the first side S1 and/or the fourth side S4. The third area DA3 may be positioned between the fourth area DA4 and the second area DA2.

The central area CDA may be an area of the reflective sheet 226 excluding the first area DA1, the second area DA2, the third area DA3, and the fourth area DA4.

The optical pattern DLP, LP may include a phosphor. The optical pattern DLP, LP may include a red-based phosphor and a green-based phosphor. The optical pattern DLP, LP may include a yellow-based phosphor.

For example, the optical pattern DLP, LP may have a yellow-based color with the naked eye. The optical pattern DLP, LP may convert blue-based light provided by the light source 224 (see FIG. 5) or the optical assembly 224 into white light.

For another example, the optical pattern DLP, LP may have a black or gray-based color with the naked eye. The optical pattern DLP, LP may absorb light provided by the light source 224 (see FIG. 5) or the optical assembly 224.

The optical pattern DLP may include dots DLP. The dots DLP may be disposed around the hole h. The dots DLP may be disposed while surrounding the hole h.

The first dots DLP1 may be disposed around at least one of the first plurality of holes h. For example, the number of the first dots DLP1 may be eight, and the eight first dots DLP1 may be sequentially positioned around the hole h while maintaining a certain interval.

The second dots DLP2 may be disposed around at least one of the second plurality of holes h. For example, the number of the second dots DLP2 may be eight, and the eight second dots DLP2 may be sequentially positioned around the hole h while maintaining a certain interval.

The third dots DLP3 may be disposed around at least one of the plurality of third holes h. For example, the number of third dots DLP3 may be eight, and the eight third dots DLP3 may be sequentially positioned around the hole h while maintaining a certain interval.

The fourth dots DLP4 may be disposed around at least one of the plurality of fourth holes h. For example, the number of fourth dots DLP4 may be three or four, and the four fourth dots DLP4 may be sequentially positioned around the hole h while maintaining a certain interval. The number of dots DLP4 around the hole h adjacent to the cut-line CL1 may be three. A dot DLP4 may be disposed in an area adjacent to the cut-line CL1 around the hole h.

For example, the size of the first dot DLP1 may be greater than the size of the second dot DLP2. The size of the second dot DLP2 may be greater than the size of the third dot DLP3. The size of the third dot DLP3 may be greater than the size of the fourth dot DLP4. As another example, the sizes of the first dot DLP1, the second dot DLP2, the third dot DLP3, and the fourth dot DLP4 may have the same size. When the sizes of the dots DLP are the same, the number of dots DLP may increase.

The optical pattern LP may include a plurality of segments LP. The plurality of segments LP may be an elongated line. Each of the plurality of lines LP may be positioned to correspond to each of the plurality of holes h. The plurality of lines LP may be positioned between the plurality of first holes h and the first side S1 and/or the fourth side S4. The plurality of lines LP may be positioned between the first dots DA1 and the first side S1 and/or the fourth side S4.

For example, the length of the line LP may correspond to the diameter of the hole h. As another example, the length of the line LP may be smaller than the diameter of the hole h. As another example, the length of the line LP may be greater than the diameter of the hole h.

The description of the second corner C2 may be applied to other corners C1, C3, and C4.

Figure 13:
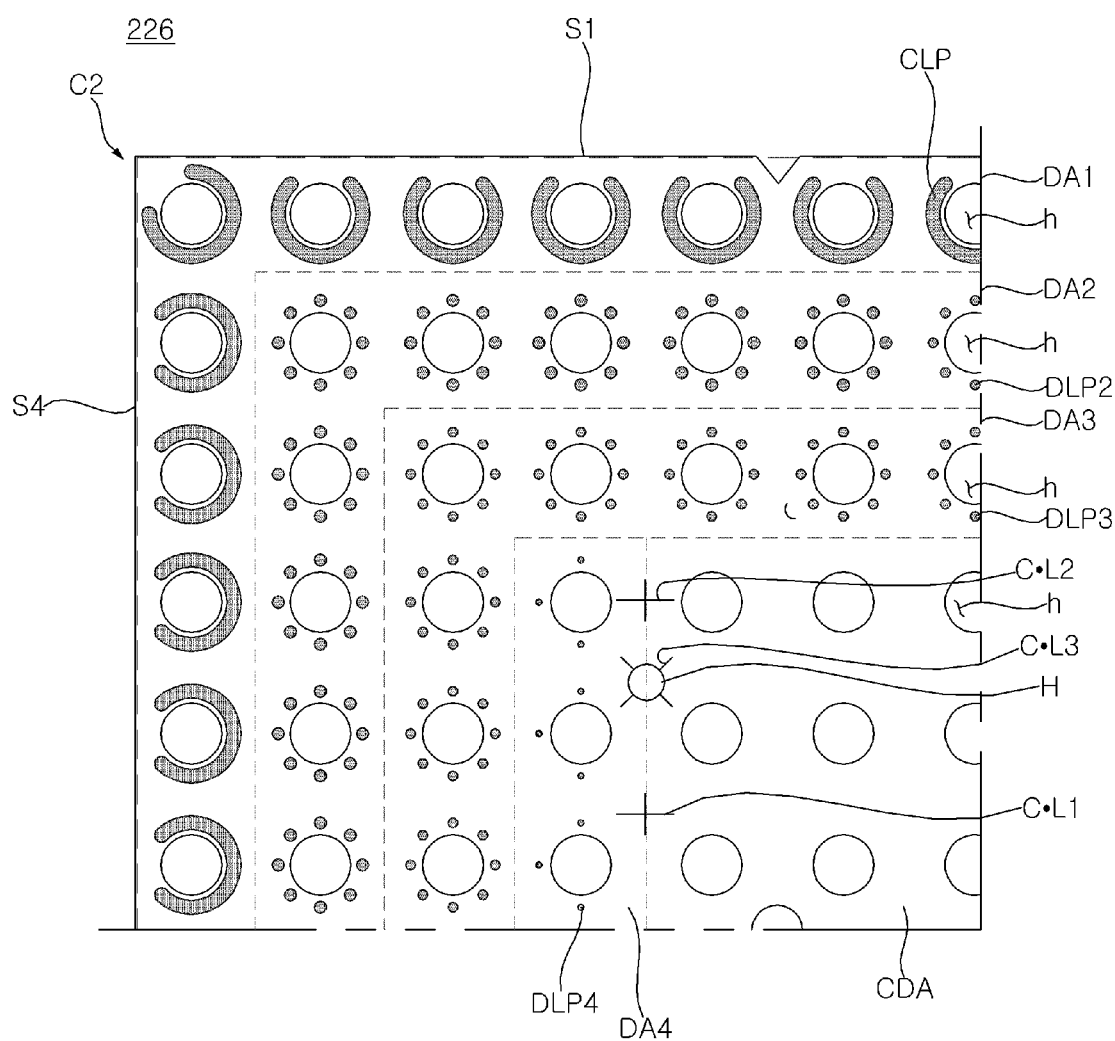

Referring to FIG. 13, the reflective sheet 226 may include a first area DA1, a second area DA2, a third area DA3, a fourth area DA4, and a central area CDA. The area DA may be referred to as a dot area DA or a pattern area DA.

The first area DA1 may be formed to extend long along the first side S1 and/or the fourth side S4. The first plurality of holes h may be sequentially formed in the first area DA1 while maintaining a certain interval. The first area DA1 may be in contact with the first side S1 and/or the fourth side S4. The description of the first side S1 and/or the fourth side S4 may be applied to other sides S2 and S3.

The second area DA2 may be formed to extend long along the first side S1 and/or the fourth side S4. The second plurality of holes h may be sequentially formed in the second area DA2 while maintaining a certain interval. The second area DA2 may be in contact with or adjacent to the first area DAL The distance of the second area DA2 from the first side S1 and/or the fourth side S4 may be greater than the distance of the first area DA1 from the first side S1 and/or the fourth side S4. The first area DA1 may be positioned between the second area DA2 and the first side S1 and/or the fourth side S4.

The third area DA3 may be formed to extend long along the first side S1 and/or the fourth side S4. The third plurality of holes h may be sequentially formed in the third area DA3 while maintaining a certain interval. The third area DA3 may be in contact with or adjacent to the second area DA2. The distance of the third area DA3 from the first side S1 and/or the fourth side S4 may be greater than the distance of the second area DA2 from the first side S1 and/or the fourth side S4. The second area DA2 may be positioned between the third area DA3 and the first area DAL The fourth area DA4 may be formed to extend long along the fourth side S4. A fourth plurality of holes h may be sequentially formed in the fourth area DA4 while maintaining a certain interval. The fourth area DA4 may be in contact with or adjacent to the third area DA3. The distance of the fourth area DA4 from the first side S1 and/or the fourth side S4 may be greater than the distance of the third area DA3 from the first side S1 and/or the fourth side S4. The third area DA3 may be positioned between the fourth area DA4 and the second area DA2.

The central area CDA may be an area of the reflective sheet 226 excluding the first area DA1, the second area DA2, the third area DA3, and the fourth area DA4.

The optical pattern DLP, CLP may include a phosphor. The optical pattern DLP, CLP may include a red-based phosphor and a green-based phosphor. The optical pattern DLP, CLP may include a yellow-based phosphor.

For example, the optical pattern DLP, CLP may have a yellow-based color with the naked eye. The optical pattern DLP, CLP may convert blue-based light provided by the light source 224 (see FIG. 5) or the optical assembly 224 into white light.

For another example, the optical pattern DLP, CLP may have a black or gray-based color with the naked eye. The optical pattern DLP, CLP may absorb light provided by the light source 224 (see FIG. 5) or the optical assembly 224.

The optical pattern DLP may include dots DLP. The dots DLP may be disposed around the hole h. The dots DLP may be disposed while surrounding the hole h.

The curved line CLP may be disposed around at least one of the first plurality of holes h. The curved line CLP may have a ring shape as a whole. The curved line CLP may extend long along the outer diameter of the hole h. A portion of the curved line CLP may be open. The open portion of the curved line CLP may face the first side S1 or the fourth side S4.

The second dots DLP2 may be disposed around at least one of the second plurality of holes h. For example, the number of the second dots DLP2 may be eight, and the eight second dots DLP2 may be sequentially positioned around the hole h while maintaining a certain interval.

The third dots DLP3 may be disposed around at least one of the plurality of third holes h. For example, the number of third dots DLP3 may be eight, and the eight third dots DLP3 may be sequentially positioned around the hole h while maintaining a certain interval.

The fourth dots DLP4 may be disposed around at least one of the plurality of fourth holes h. For example, the number of fourth dots DLP4 may be three or four, and the four fourth dots DLP4 may be sequentially positioned around the hole h while maintaining a certain interval. The number of dots DLP4 around the hole h adjacent to the cut-line CL1, CL2, CL3 may be three. A dot DLP4 may be disposed in an area adjacent to the cut-line CL1, CL2, CL3 around the hole h.

For example, the size of the second dot DLP2 may be greater than the size of the third dot DLP3. The size of the third dot DLP3 may be greater than the size of the fourth dot DLP4. As another example, the sizes of the second dot DLP2, the third dot DLP3, and the fourth dot DLP4 may have the same size. When the sizes of the dots DLP are the same, the number of dots DLP may increase.

The description of the second corner C2 may be applied to other corners C1, C3, and C4.

Figure 14:
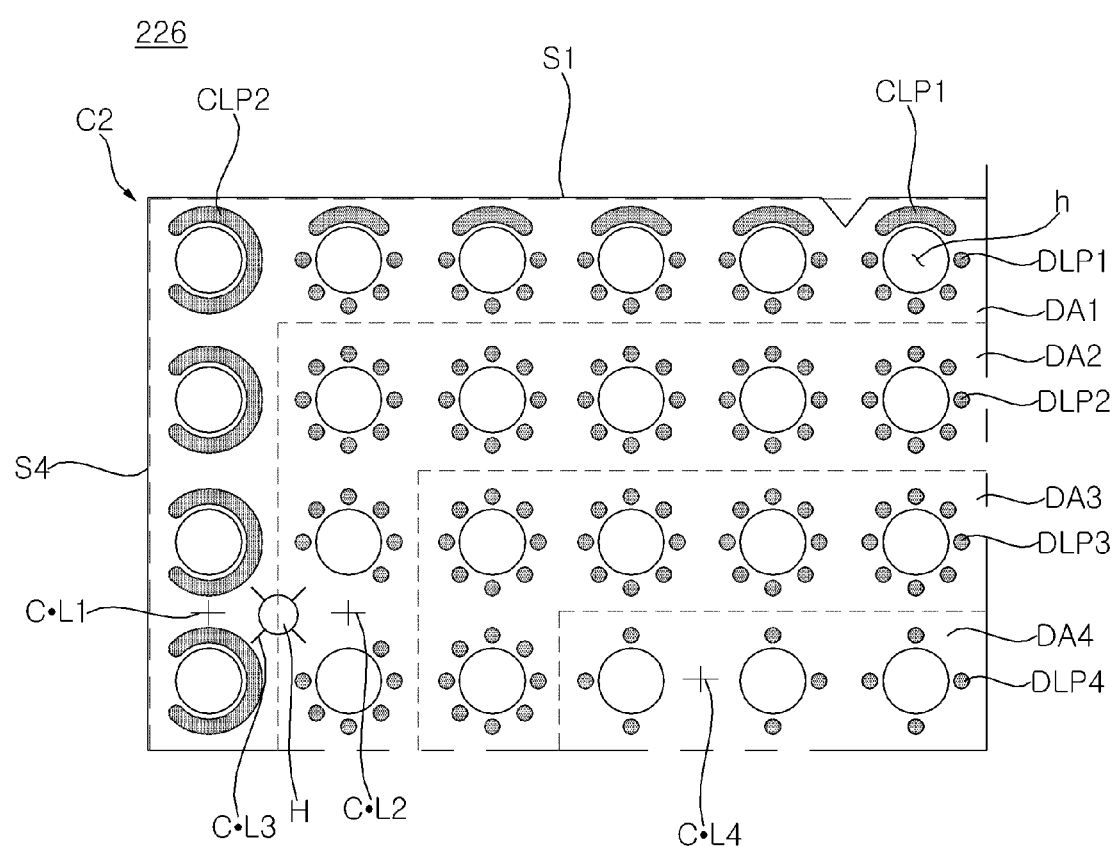

Referring to FIG. 14, the reflective sheet 226 may include a first area DA1, a second area DA2, a third area DA3, and a fourth area DA4. The area DA may be referred to as a dot area DA or a pattern area DA.

The first area DA1 may be formed to extend long along the first side S1 and/or the fourth side S4. The first plurality of holes h may be sequentially formed in the first area DA1 while maintaining a certain interval. The first area DA1 may be in contact with the first side S1 and/or the fourth side S4. The description of the first side S1 and/or the fourth side S4 may be applied to other sides S2 and S3 (see FIG. 7).

The second area DA2 may be formed to extend long along the first side S1 and/or the fourth side S4. The second plurality of holes h may be sequentially formed in the second area DA2 while maintaining a certain interval. The second area DA2 may be in contact with or adjacent to the first area DA1. The distance of the second area DA2 from the first side S1 and/or the fourth side S4 may be greater than the distance of the first area DA1 from the first side S1 and/or the fourth side S4. The first area DA1 may be positioned between the second area DA2 and the first side S1 and/or the fourth side S4.

The third area DA3 may be formed to extend long along the first side S1 and/or the fourth side S4. The third plurality of holes h may be sequentially formed in the third area DA3 while maintaining a certain interval. The third area DA3 may be in contact with or adjacent to the second area DA2. The distance of the third area DA3 from the first side S1 and/or the fourth side S4 may be greater than the distance of the second area DA2 from the first side S1 and/or the fourth side S4. The second area DA2 may be positioned between the third area DA3 and the first area DAL The fourth area DA4 may be formed to extend long along the first side S1. A fourth plurality of holes h may be sequentially formed in the fourth area DA4 while maintaining a certain interval. The fourth area DA4 may be in contact with or adjacent to the third area DA3. The distance of the fourth area DA4 from the first side S1 and/or the fourth side S4 may be greater than the distance of the third area DA3 from the first side S1 and/or the fourth side S4. The third area DA3 may be positioned between the fourth area DA4 and the second area DA2.

The optical pattern DLP, CLP may include a phosphor. The optical pattern DLP, CLP may include a red-based phosphor and a green-based phosphor. The optical pattern DLP, CLP may include a yellow-based phosphor.

For example, the optical pattern DLP, CLP may have a yellow-based color with the naked eye. The optical pattern DLP, CLP may convert blue-based light provided by the light source 224 (see FIG. 5) or the optical assembly 224 into white light.

For another example, the optical pattern DLP, CLP may have a black or gray-based color with the naked eye. The optical pattern DLP, CLP may absorb light provided by the light source 224 (see FIG. 5) or the optical assembly 224.

The optical pattern DLP may include dots DLP. The dots DLP may be disposed around the hole h. The dots DLP may be disposed while surrounding the hole h.

A curved line CLP may be disposed around at least one of the first plurality of holes h. The curved line CLP may have a ring shape, a fan-shape, or a semicircular shape as a whole. The curved line CLP may extend long in an arc along the outer diameter of the hole h. A portion of the curved line CLP may be open. The open portion of the curved line CLP may face the fourth side S4. The curved line CLP may be formed adjacent to the first side S1.

In the hole h adjacent to the first side S1, a curved line CLP1 may be positioned between the hole h and the first side S1. Dots DLP1 may face the curved line CLP1 with respect to the hole h. For example, the arc formed by the dots DLP1 may be larger than the arc formed by the curved line CLP1. As another example, five dots DLP1 may be disposed around the hole h, and the curved line CLP1 may be disposed in the remaining area. The curvature of the arc formed by the five dots DLP1 may be the same as the curvature of the arc formed by the curved line CLP1.

In the hole h adjacent to the fourth side S4, a curved line CLP2 may be disposed around the hole h, and the open portion of the curved line CLP2 may face the fourth side S4. The width of the curved line CLP2 adjacent to the fourth side S4 may be substantially the same as the width of the curved line CLP1 adjacent to the first side S1.

Second dots DLP2 may be disposed around at least one of the second plurality of holes h. For example, the number of the second dots DLP2 may be eight, and the eight second dots DLP2 may be sequentially positioned around the hole h while maintaining a certain interval. The number of dots DLP2 around the hole h adjacent to the cut-line CL2 may be six. The dot DLP2 may be disposed in an area adjacent to the cut-line CL2 around the hole h.

Third dots DLP3 may be disposed around at least one of the plurality of third holes h. For example, the number of third dots DLP3 may be eight, and the eight third dots DLP3 may be sequentially positioned around the hole h while maintaining a certain interval.

Fourth dots DLP4 may be disposed around at least one of the plurality of fourth holes h. For example, the number of fourth dots DLP4 may be three or four, and the four fourth dots DLP4 may be sequentially positioned around the hole h while maintaining a certain interval. The number of dots DLP4 around the hole h adjacent to the cut-line CL4 may be three. A dot DLP4 may be disposed in an area adjacent to the cut-line CL4 around the hole h.

For example, the size of the second dot DLP2 may be greater than the size of the third dot DLP3. The size of the third dot DLP3 may be greater than the size of the fourth dot DLP4. As another example, the sizes of the second dot DLP2, the third dot DLP3, and the fourth dot DLP4 may have the same size. When the sizes of the dots DLP are the same, the number of dots DLP may increase.

The description of the second corner C2 may be applied to other corners C1, C3, and C4.

Figure 15:
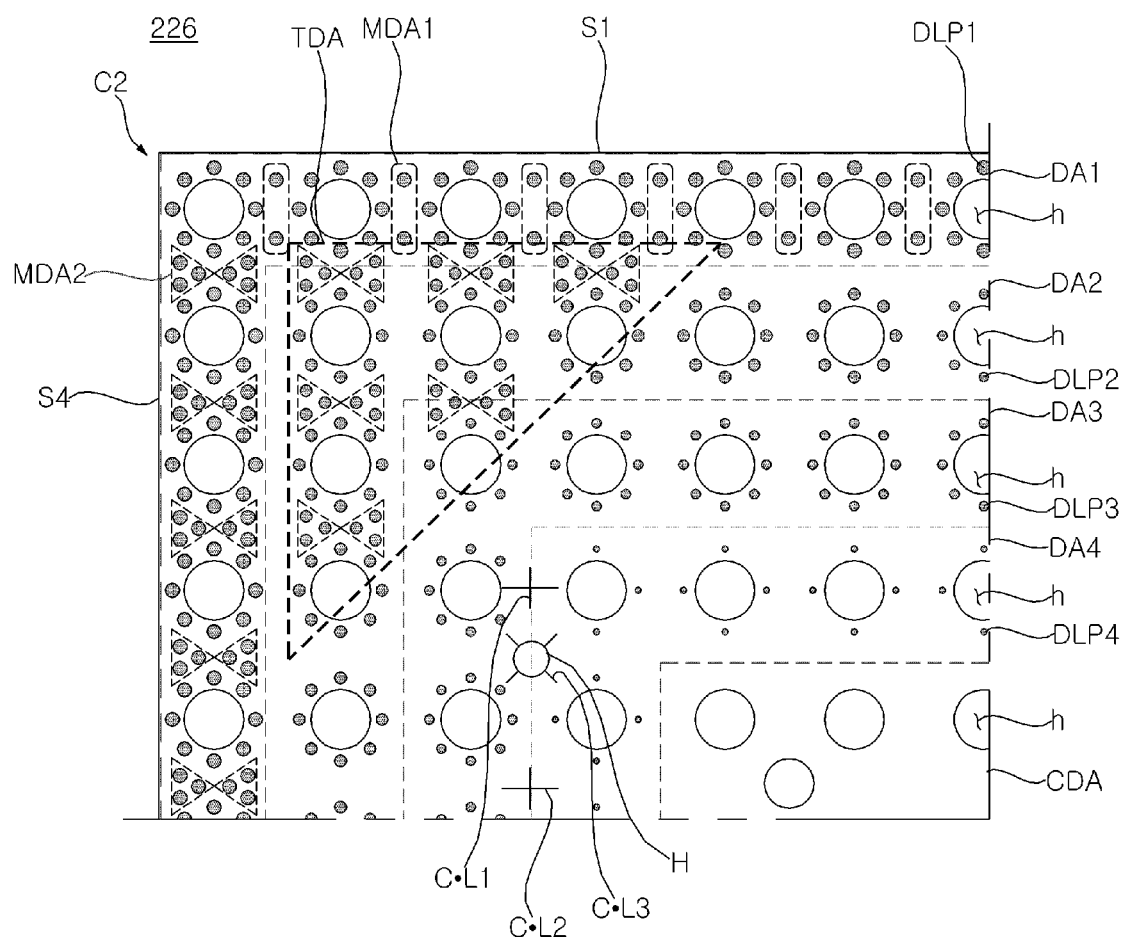

Referring to FIG. 15, the reflective sheet 226 may include a first area DA1, a second area DA2, a third area DA3, a fourth area DA4, a central area CDA, an intermediate area MDA1, MDA2, and a triangular area TDA. The area DA may be referred to as a dot area DA or a pattern area DA.

The first area DA1 may be formed to extend long along the first side S1 and/or the fourth side S4. A first plurality of holes h may be sequentially formed in the first area DA1 while maintaining a certain interval. The first area DA1 may be in contact with the first side S1 and/or the fourth side S4. The description of the first side S1 and/or the fourth side S4 may be applied to other sides S2 and S3 (see FIG. 7).

The second area DA2 may be formed to extend long along the first side S1 and/or the fourth side S4. A second plurality of holes h may be sequentially formed in the second area DA2 while maintaining a certain interval. The second area DA2 may be in contact with or adjacent to the first area DA1. The distance of the second area DA2 from the first side S1 and/or the fourth side S4 may be greater than the distance of the first area DA1 from the first side S1 and/or the fourth side S4. The first area DA1 may be positioned between the second area DA2 and the first side S1 and/or the fourth side S4.

The third area DA3 may be formed to extend long along the first side S1 and/or the fourth side S4. A third plurality of holes h may be sequentially formed in the third area DA3 while maintaining a certain interval. The third area DA3 may be in contact with or adjacent to the second area DA2. The distance of the third area DA3 from the first side S1 and/or the fourth side S4 may be greater than the distance of the second area DA2 from the first side S1 and/or the fourth side S4. The second area DA2 may be positioned between the third area DA3 and the first area DA1.

The fourth area DA4 may be formed to be long along the first side S1 and/or the fourth side S4. A fourth plurality of holes h may be sequentially formed in the fourth area DA4 while maintaining a certain interval. The fourth area DA4 may be in contact with or adjacent to the third area DA3. The distance of the fourth area DA4 from the first side S1 and/or the fourth side S4 may be greater than the distance of the third area DA3 from the first side S1 and/or the fourth side S4. The third area DA3 may be positioned between the fourth area DA4 and the second area DA2.

The central area CDA may be an area of the reflective sheet 226 excluding the first area DA1, the second area DA2, the third area DA3, and the fourth area DA4.

The optical pattern DLP may include a phosphor. The optical pattern DLP may include a red-based phosphor and a green-based phosphor. The optical pattern DLP may include a yellow-based phosphor.

For example, the optical pattern DLP may have a yellow-based color with the naked eye. The optical pattern DLP may convert blue-based light provided by the light source 224 (see FIG. 5) or the optical assembly 224 into white light.

For another example, the optical pattern DLP may have a black or gray-based color with the naked eye. The optical pattern DLP may absorb light provided by the light source 224 (see FIG. 5) or the optical assembly 224.

The optical pattern DLP may include dots DLP. The dots DLP may be disposed around the hole h. The dots DLP may be disposed while surrounding the hole h.

The first dots DLP1 may be disposed around at least one of the first plurality of holes h. For example, the number of the first dots DLP1 may be eight, and the eight first dots DLP1 may be sequentially positioned around the hole h while maintaining a certain interval.

The second dots DLP2 may be disposed around at least one of the second plurality of holes h. For example, the number of the second dots DLP2 may be eight, and the eight second dots DLP2 may be sequentially positioned around the hole h while maintaining a certain interval.

The third dots DLP3 may be disposed around at least one of the plurality of third holes h. For example, the number of third dots DLP3 may be eight, and the eight third dots DLP3 may be sequentially positioned around the hole h while maintaining a certain interval.

The fourth dots DLP4 may be disposed around at least one of the plurality of fourth holes h. For example, the number of fourth dots DLP4 may be three or four, and the four fourth dots DLP4 may be sequentially positioned around the hole h while maintaining a certain interval. The number of dots DLP4 around the hole h adjacent to the cut-line CL1 may be three. A dot DLP4 may be disposed in an area adjacent to the cut-line CL1 around the hole h.

For example, the size of the first dot DLP1 may be larger than the size of the second dot DLP2. The size of the second dot DLP2 may be larger than the size of the third dot DLP3. The size of the third dot DLP3 may be larger than the size of the fourth dot DLP4.

As another example, the sizes of the first dot DLP1, the second dot DLP2, the third dot DLP3, and the fourth dot DLP4 may be the same. When the sizes of the dots DLP are the same, the number of dots DLP may increase.

The intermediate area MDA1 may be positioned between a first plurality of holes h. The intermediate area MDA1 may be formed between the first plurality of holes h adjacent to the first side S1. The intermediate area MDA1 may be formed to extend long in a direction that intersects with or is perpendicular to the length direction of the first side S1. The dots DLP1 may be disposed in the intermediate area MDA1. For example, a plurality of dots DLP1 may be disposed in the length direction of the intermediate area MDA1. For example, the number of dots DLP1 may be two.

The intermediate area MDA2 may be positioned between the first plurality of holes h. The intermediate area MDA2 may be formed between the first plurality of holes h adjacent to the fourth side S4. A plurality of intermediate areas MDA2 may be formed between the first plurality of holes h adjacent to the fourth side S4. The intermediate area MDA2 may form a triangle. The dots DLP1 may be disposed in the intermediate area MDA2. For example, a plurality of dots DLP1 may be disposed in the intermediate area MDA2. For example, the number of dots DLP1 may be three.

The intermediate area MDA2 may be positioned between a second plurality of holes h. The intermediate area MDA2 may be formed between the second plurality of holes h adjacent to the fourth side S4. A plurality of intermediate areas MDA2 may be formed between the second plurality of holes h adjacent to the fourth side S4. The intermediate area MDA2 may form a triangle. The dots DLP2 may be disposed in the intermediate area MDA2. For example, a plurality of dots DLP2 may be disposed in the intermediate area MDA2. For example, the number of dots DLP2 may be three.

The intermediate area MDA2 may be formed between the first area DA1 and the second area DA2. The intermediate area MDA2 may be formed between the second area DA2 and the third area DA3. The intermediate area MDA2 may form a triangular area TDA as a whole throughout the second area DA2 and the third area DA3.

The description of the second corner C2 may be applied to other corners C1, C3, and C4.

Figure 16:
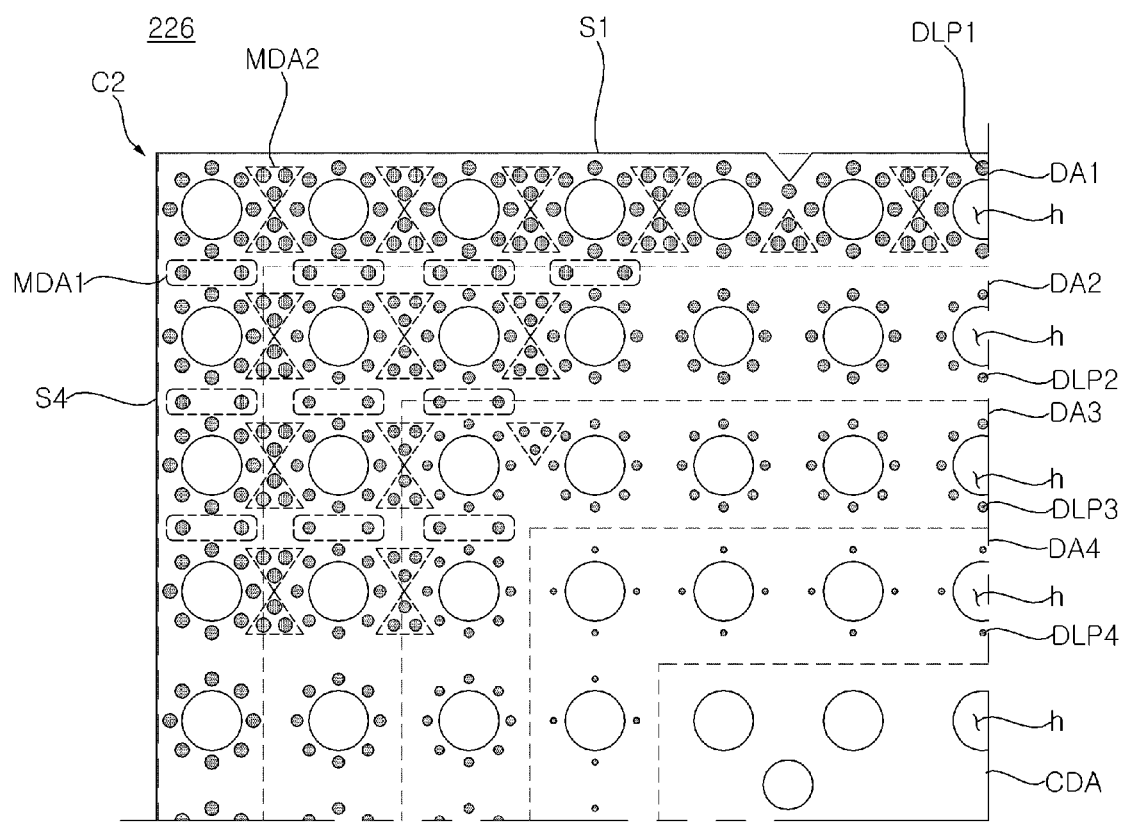

Referring to FIG. 16, the reflective sheet 226 may include a first area DA1, a second area DA2, a third area DA3, a fourth area DA4, a central area CDA, and an intermediate area MDA1, MDA2. The area DA may be referred to as a dot area DA or a pattern area DA.

The first area DA1 may be formed to extend long along the first side S1 and/or the fourth side S4. A first plurality of holes h may be sequentially formed in the first area DA1 while maintaining a certain interval. The first area DA1 may be in contact with the first side S1 and/or the fourth side S4. The description of the first side S1 and/or the fourth side S4 may be applied to other sides S2 and S3 (see FIG. 7).

The second area DA2 may be formed to extend long along the first side S1 and/or the fourth side S4. A second plurality of holes h may be sequentially formed in the second area DA2 while maintaining a certain interval. The second area DA2 may be in contact with or adjacent to the first area DA1. The distance of the second area DA2 from the first side S1 and/or the fourth side S4 may be greater than the distance of the first area DA1 from the first side S1 and/or the fourth side S4. The first area DA1 may be positioned between the second area DA2 and the first side S1 and/or the fourth side S4.

The third area DA3 may be formed to extend long along the first side S1 and/or the fourth side S4. A third plurality of holes h may be sequentially formed in the third area DA3 while maintaining a certain interval. The third area DA3 may be in contact with or adjacent to the second area DA2. The distance of the third area DA3 from the first side S1 and/or the fourth side S4 may be greater than the distance of the second area DA2 from the first side S1 and/or the fourth side S4. The second area DA2 may be positioned between the third area DA3 and the first area DA1.

The fourth area DA4 may be formed to be long along the first side S1 and/or the fourth side S4. A fourth plurality of holes h may be sequentially formed in the fourth area DA4 while maintaining a certain interval. The fourth area DA4 may be in contact with or adjacent to the third area DA3. The distance of the fourth area DA4 from the first side S1 and/or the fourth side S4 may be greater than the distance of the third area DA3 from the first side S1 and/or the fourth side S4. The third area DA3 may be positioned between the fourth area DA4 and the second area DA2.

The central area CDA may be an area of the reflective sheet 226 excluding the first area DA1, the second area DA2, the third area DA3, and the fourth area DA4.

The optical pattern DLP may include a phosphor. The optical pattern DLP may include a red-based phosphor and a green-based phosphor. The optical pattern DLP may include a yellow-based phosphor.

For example, the optical pattern DLP may have a yellow-based color with the naked eye. The optical pattern DLP may convert blue-based light provided by the light source 224 (see FIG. 5) or the optical assembly 224 into white light.

For another example, the optical pattern DLP may have a black or gray-based color with the naked eye. The optical pattern DLP may absorb light provided by the light source 224 (see FIG. 5) or the optical assembly 224.

The optical pattern DLP may include dots DLP. The dots DLP may be disposed around the hole h. The dots DLP may be disposed while surrounding the hole h.

The first dots DLP1 may be disposed around at least one of the first plurality of holes h. For example, the number of the first dots DLP1 may be eight, and the eight first dots DLP1 may be sequentially positioned around the hole h while maintaining a certain interval.

The second dots DLP2 may be disposed around at least one of the second plurality of holes h. For example, the number of the second dots DLP2 may be eight, and the eight second dots DLP2 may be sequentially positioned around the hole h while maintaining a certain interval.

The third dots DLP3 may be disposed around at least one of the plurality of third holes h. For example, the number of third dots DLP3 may be eight, and the eight third dots DLP3 may be sequentially positioned around the hole h while maintaining a certain interval.

The fourth dots DLP4 may be disposed around at least one of the plurality of fourth holes h. For example, the number of fourth dots DLP4 may be four, and the four fourth dots DLP4 may be sequentially positioned around the hole h while maintaining a certain interval.

For example, the size of the first dot DLP1 may be larger than the size of the second dot DLP2. The size of the second dot DLP2 may be larger than the size of the third dot DLP3. The size of the third dot DLP3 may be larger than the size of the fourth dot DLP4.

As another example, the sizes of the first dot DLP1, the second dot DLP2, the third dot DLP3, and the fourth dot DLP4 may be the same. When the sizes of the dots DLP are the same, the number of dots DLP may increase.

The intermediate area MDA1 may be positioned between a first plurality of holes h. The intermediate area MDA1 may be formed between the first plurality of holes h adjacent to the fourth side S4. The intermediate area MDA1 may be formed to extend long in a direction that intersects with or is perpendicular to the length direction of the fourth side S4. The dots DLP1 may be disposed in the intermediate area MDA1. For example, a plurality of dots DLP1 may be disposed in the length direction of the intermediate area MDA1. For example, the number of dots DLP1 may be two.

The intermediate area MDA2 may be positioned between the first plurality of holes h. The intermediate area MDA2 may be formed between the first plurality of holes h adjacent to the first side S1. A plurality of intermediate areas MDA2 may be formed between the first plurality of holes h adjacent to the first side S1. The intermediate area MDA2 may form a triangle. The dots DLP1 may be disposed in the intermediate area MDA2. For example, a plurality of dots DLP1 may be disposed in the intermediate area MDA2. For example, the number of dots DLP1 may be three.

The intermediate area MDA1 may be positioned between a second plurality of holes h. The intermediate area MDA1 may be formed between the second plurality of holes h adjacent to the fourth side S4. The intermediate area MDA1 may be formed to extend long in a direction that intersects with or is perpendicular to the length direction of the fourth side S4. The dots DLP2 may be disposed in the intermediate area MDA1. For example, a plurality of dots DLP2 may be disposed in the intermediate area MDA1. For example, the number of dots DLP2 may be three.

The intermediate area MDA2 may be positioned between the second plurality of holes h. The intermediate area MDA2 may be formed between the second plurality of holes h adjacent to the first side S1. A plurality of intermediate areas MDA2 may be formed between the second plurality of holes h adjacent to the first side S1. The intermediate area MDA2 may form a triangle. The dots DLP2 may be disposed in the intermediate area MDA2. For example, a plurality of dots DLP2 may be disposed in the intermediate area MDA2. For example, the number of dots DLP2 may be three.

The intermediate area MDA1 may be positioned between the third plurality of holes h. The intermediate area MDA1 may be formed between the third plurality of holes h adjacent to the fourth side S4. The intermediate area MDA1 may be formed to extend long in a direction that intersects with or is perpendicular to the length direction of the fourth side S4. The dots DLP3 may be disposed in the intermediate area MDA1. For example, a plurality of dots DLP3 may be disposed in the length direction of the intermediate area MDA1. For example, the number of dots DLP3 may be two.

The intermediate area MDA2 may be positioned between the third plurality of holes h. The intermediate area MDA2 may be formed between the third plurality of holes h adjacent to the first side S1. A plurality of intermediate areas MDA2 may be formed between the third plurality of holes h adjacent to the first side S1. The intermediate area MDA2 may form a triangle. The dots DLP3 may be disposed in the intermediate area MDA2. For example, a plurality of dots DLP3 may be disposed in the intermediate area MDA2. For example, the number of dots DLP3 may be three.

The intermediate area MDA2 may be formed between the first area DA1 and the second area DA2. The intermediate area MDA2 may be formed between the second area DA2 and the third area DA3.

The description of the second corner C2 may be applied to other corners C1, C3, and C4.

Figure 17:
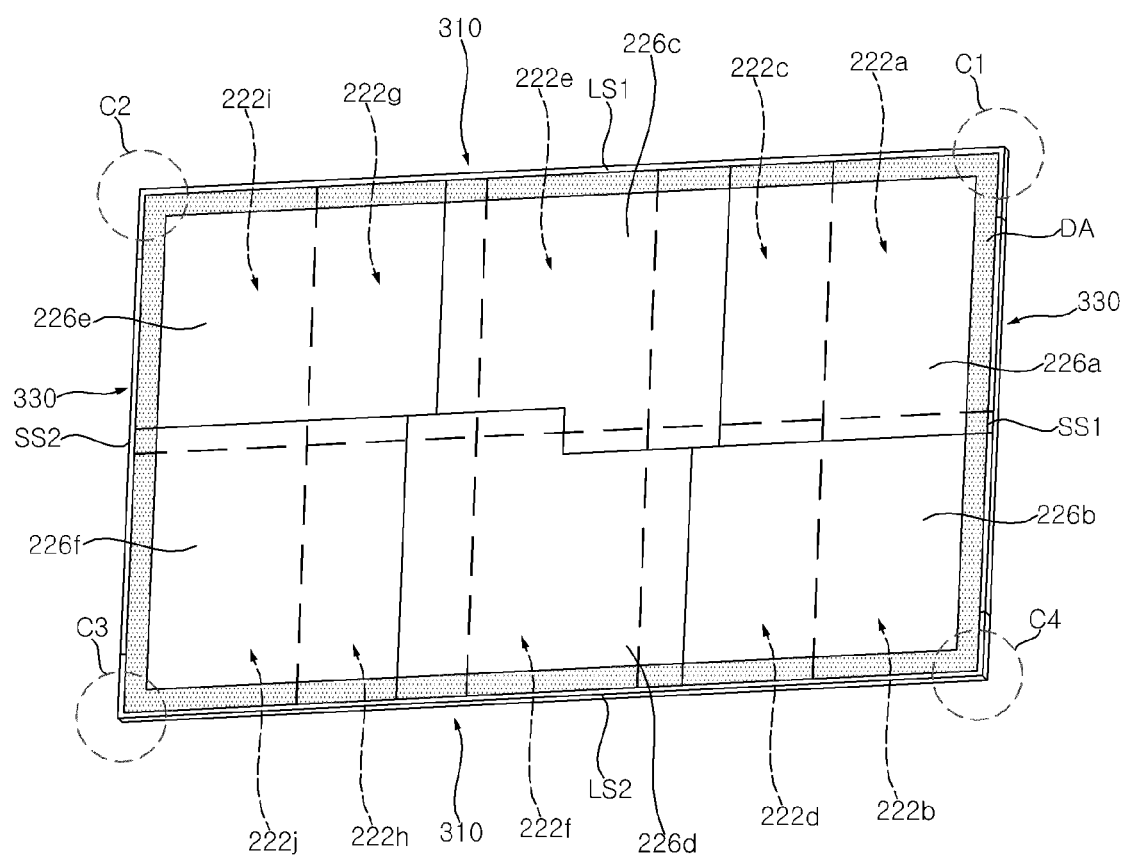
FIGS. 17 to 30 are diagrams illustrating examples of a coupling structure of a display device according to embodiments of the present disclosure.

Referring to FIG. 17, an inner frame 310, 330 may be coupled to sides LS1, LS2, SS1, SS2 or edges LS1, LS2, SS1, SS2 of the rear frame 130. The inner frame 310, 330 may include a plurality of parts 310 and 330. A first part 310 may be coupled to a first long side LS1 of the rear frame 130. A second part 310 may be coupled to a second long side LS2 of the rear frame 130. A third part 330 may be coupled to a first short side SS1 of the rear frame 130. A fourth part 330 may be coupled to a second short side SS2 of the rear frame 130. The first part 310 may be coupled to the third part 330 and the fourth part 330, and the second part 310 may be coupled to the third part 330 and the fourth part 330. The first part 310, the second part 310, the third part 330, or the fourth part 330 may be referred to the inner frame 310, 330.

Figure 18:
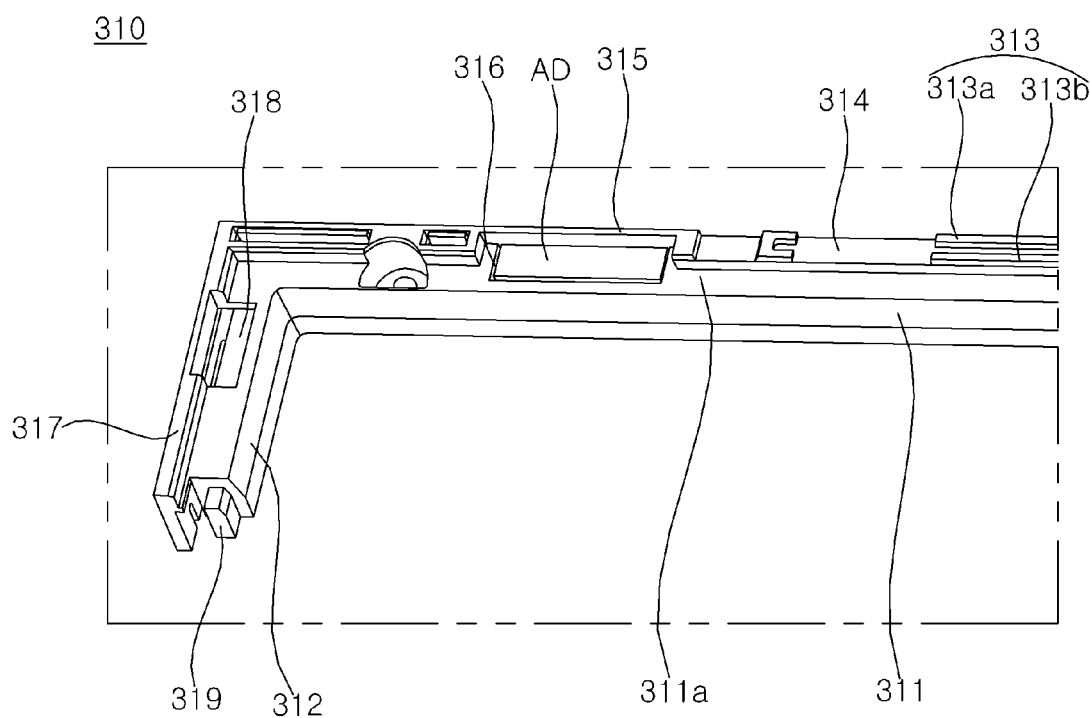
Figure 19:
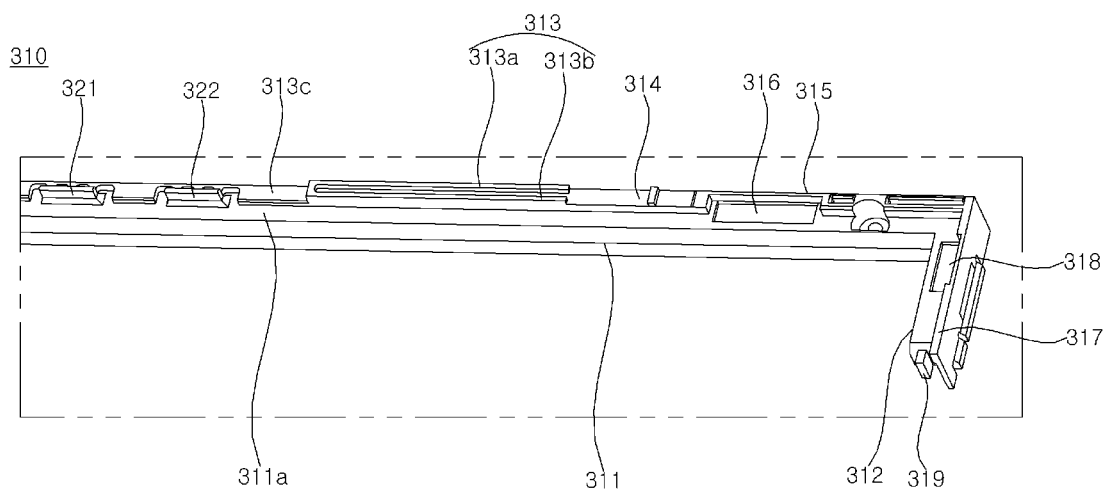

Referring to FIGS. 18 and 19, the inner frame 310 may extend long, and may have a curved bar shape at both ends. A center part 311 may extend long, and may have a rectangular cross-section. A support surface 311a may form one surface of the center part 311. A frame wall 313 may protrude from the support surface 311a, and extend long along the length direction of the center part 311. A plurality of frame walls 313 may be formed side by side. A first frame wall 313a may be spaced apart from a second frame wall 313b.

A receiving portion 314 may be formed on the frame wall 313. The receiving portion 314 may provide a flat surface on the upper end of the frame wall 313. The length of the receiving portion 314 may be smaller than the length of the frame wall 313. A recessed portion 316 may be formed on the support surface 311a. The recessed portion 316 may be formed while forming a step lowered from the support surface 311a. A cover wall 315 may be positioned at one side of the recessed portion 316. The cover wall 315 may be positioned on an extension line of a first frame wall 313a. A pad AD or an adhesive pad AD may be fixed to the recessed portion 316, and the pad AD or the adhesive pad AD may support the optical layer 129 (see FIG. 3).

The side part 312 may extend while being bent from one or both ends of the center part 311. The support surface 311a may form one surface of the side part 312. A coupling rib 319 may protrude from one side of the side part 312. The recessed portion 318 may form a step lowered from the support surface 311a of the side part 312. A cover wall 317 may be positioned in one side of the recessed portion 318 of the side part 312, and may be connected to the cover wall 315 of the center part 311.

Figure 20:
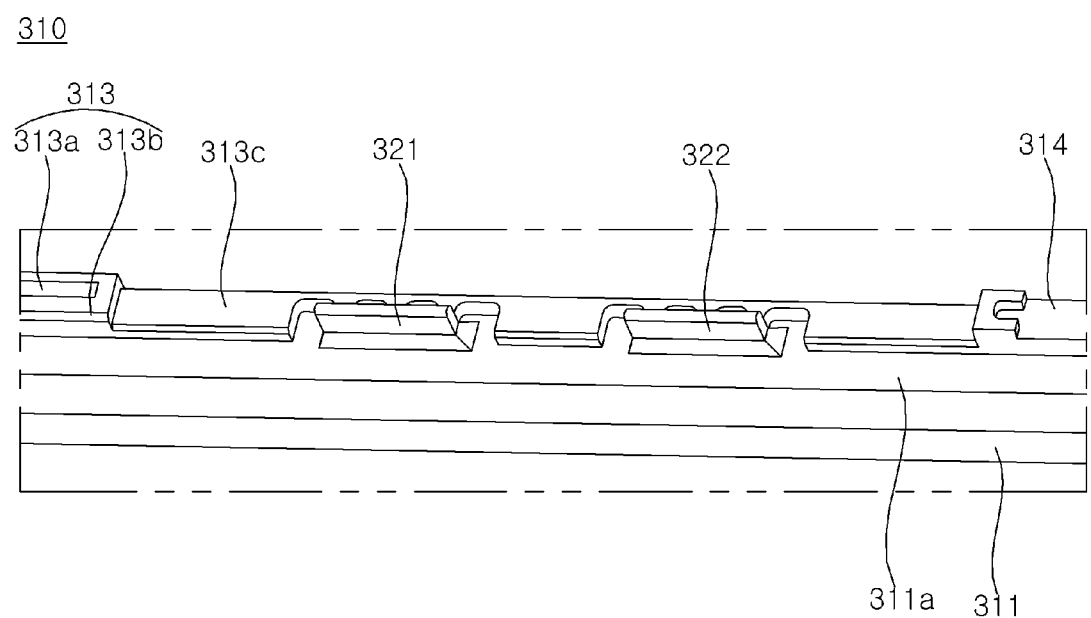

Referring to FIGS. 19 and 20, a coupling rib 321, 322 may protrude from the support surface 311a of the center part 311, and there may be a plurality of coupling ribs 321, 322. A first coupling rib 321 may protrude from the support surface 311a of the center part 311, and extend long in the length direction of the center part 311. A second coupling rib 322 may be positioned adjacent to the first coupling rib 321, and may be positioned on an extension line of the first coupling rib 321.

A third frame wall 313c may extend from the first frame wall 313a and/or the second frame wall 313b. The third frame wall 313c may be positioned adjacent to the first coupling rib 321 and the second coupling rib 322, and may be in contact with one edge of the center part 311. The height of the third frame wall 313c may be smaller than the height of the first frame wall 313a and/or the second frame wall 313b.

Figure 21:
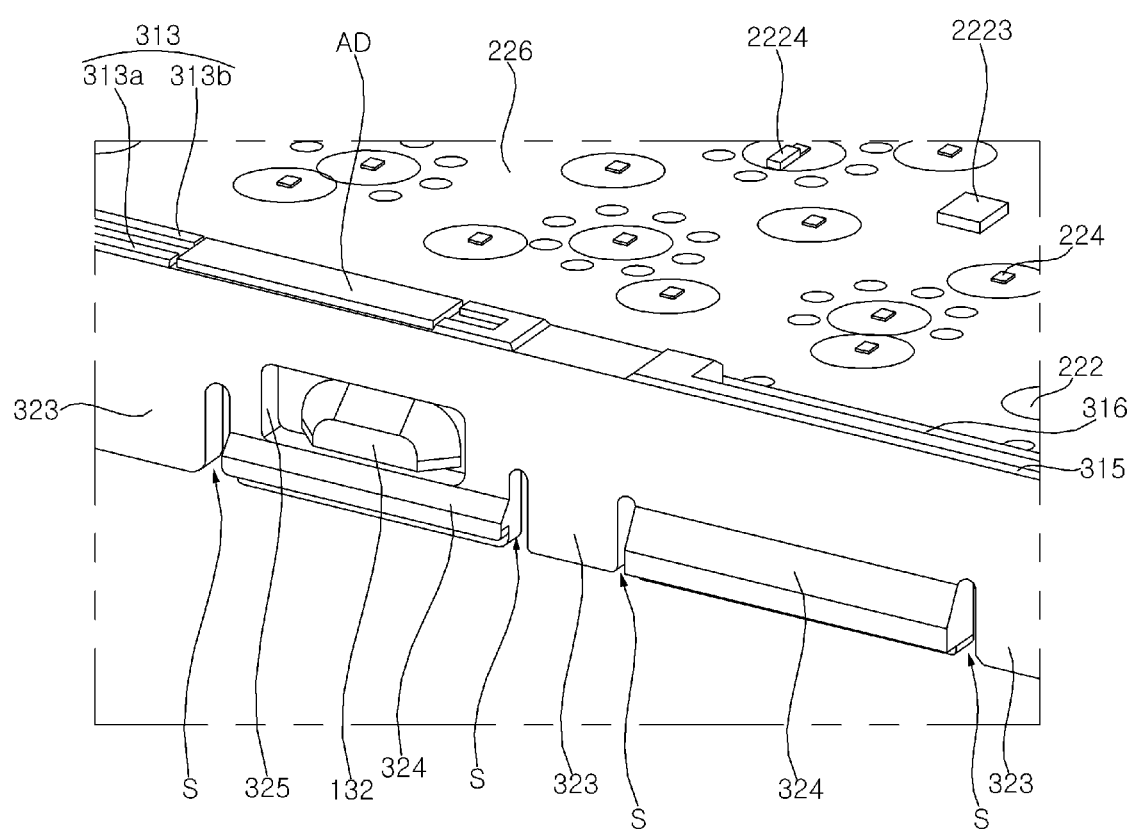

Referring to FIG. 21 together with FIG. 19, the inner frame 310 may include a middle coupler 324, 325. The middle coupler 324, 325 may be positioned on the outer surface of the center part 311. There may be a plurality of middle couplers 324 and 325. A first middle coupler 324 may be defined by slots S or slits S formed by cutting-out an outer surface 323 of the center part 311.

A first middle coupler 324, 325 may include a locking protrusion 324 protruding from the outer surface 323 of the center part 311. The locking protrusion 324 may be formed adjacent to a distal edge of the first middle coupler 324, 325 in the length direction of the center part 311. A coupling hole 325 may penetrate the first middle coupler 324, 325 and be formed between the support surface 311a and the locking protrusion 324. The protrusion 132 of the frame 130 may be inserted into the coupling hole 325 of the first middle coupler 324, 325.

A second middle coupler 324 may be positioned adjacent to the first middle coupler 324, 325 in the length direction of the center part 311. The second middle coupler 324 may include a locking protrusion 324 protruding from the outer surface of the center part 311. The locking protrusion 324 may be formed adjacent to a distal edge of the second middle coupler 324 in the length direction of the center part 311.

The pad AD or the adhesive pad AD may be positioned on or fixed to the receiving portion 314.

Figure 22:
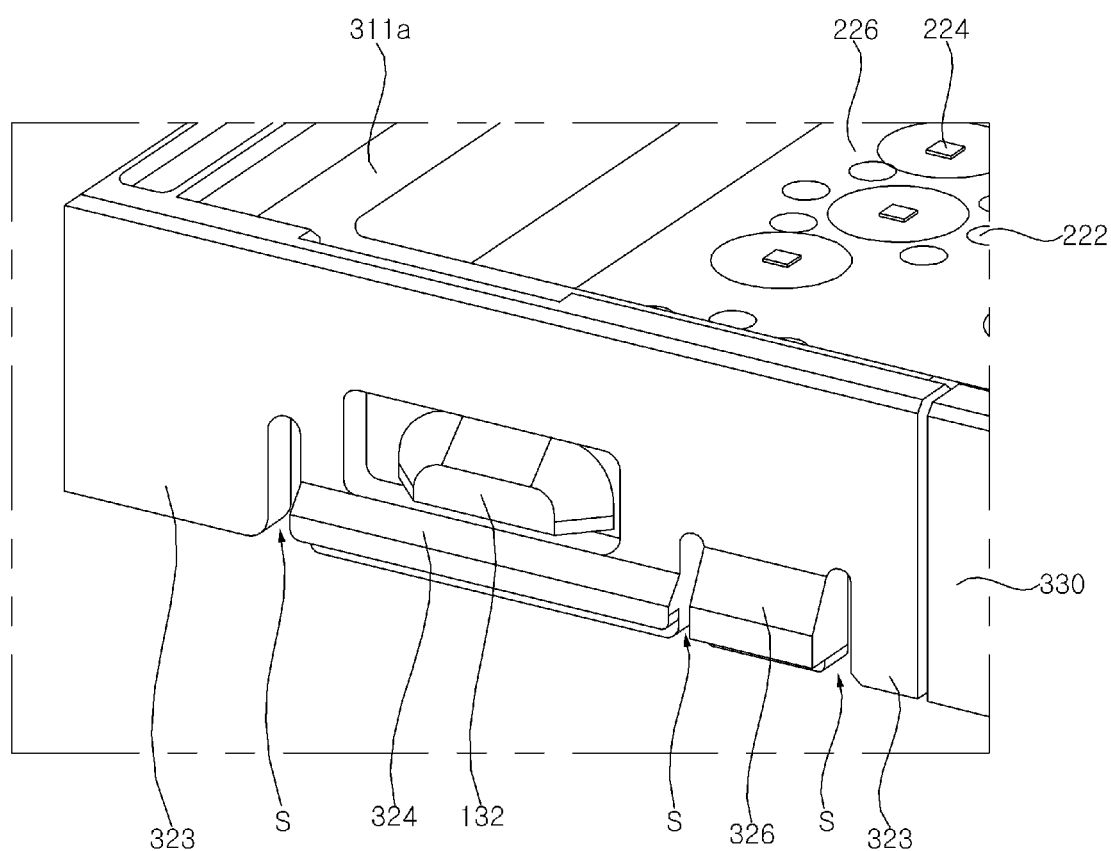

Referring to FIG. 22 together with FIG. 19, the inner frame 310 may include a side middle coupler 324, 325, 326. The side middle coupler 324, 325, 326 may be positioned on the outer surface of the side part 312. There may be a plurality of side middle couplers 324, 325, and 326. The side middle coupler 324, 325 may be defined by slots S formed by cutting out the outer surface 323 of the side part 312.

A third middle coupler 324, 325 may include a locking protrusion 324 protruding from the outer surface 323 of the side part 312. The locking protrusion 324 may be formed adjacent to a distal edge of the third middle coupler 324, 325 in the length direction of the side part 312. A coupling hole 325 may penetrate the third middle coupler 324, 325 and be formed between the support surface 311a and the locking protrusion 324. The protrusion 132 of the frame 130 may be inserted into the coupling hole 325 of the third middle coupler 324, 325.

A fourth middle coupler 326 may be positioned adjacent to the third middle coupler 324, 325 in the length direction of the side part 312. The fourth middle coupler 326 may include a locking protrusion 326 protruding from the outer surface 323 of the side part 312. The locking protrusion 326 may be formed adjacent to the distal edge of the fourth middle coupler 326 in the length direction of the side part 312. One slot S may be formed between the third middle coupler 324, 325 and the fourth middle coupler 326.

Figure 23:
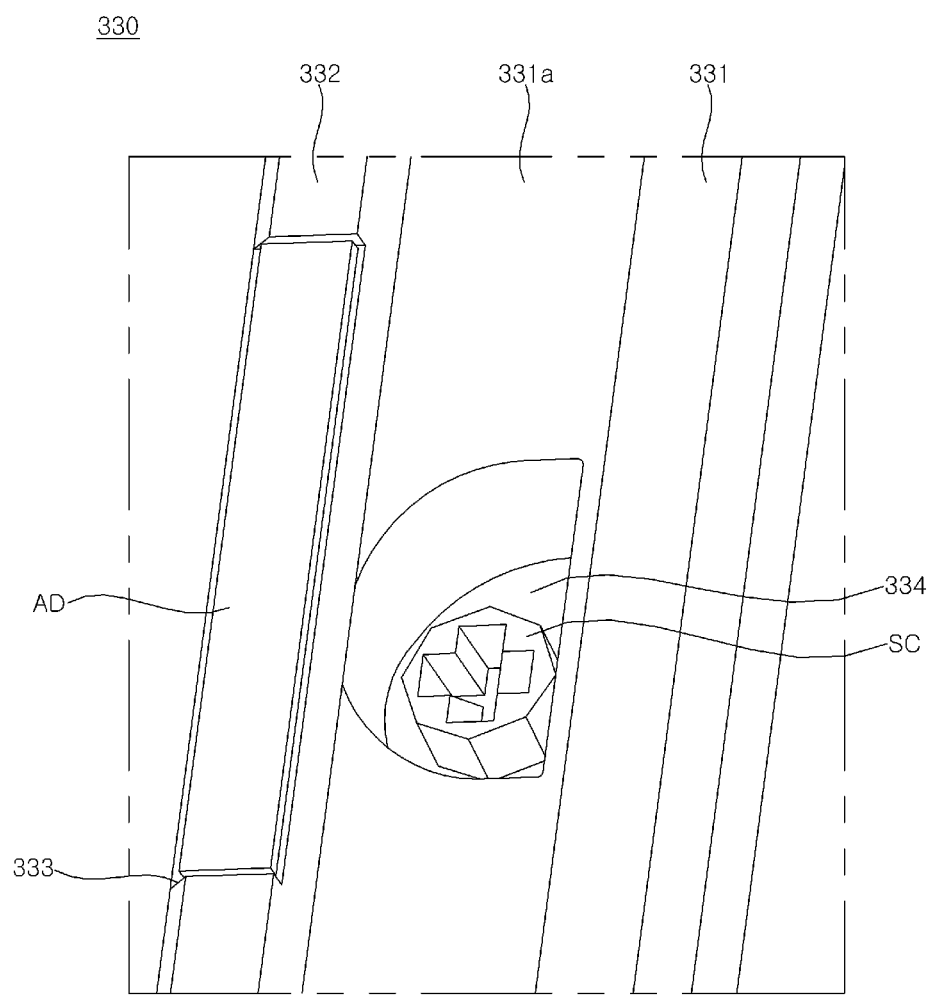

Referring to FIG. 23, the inner frame 330, 331 may include a support surface 331a and a sidewall 332. The support surface 331a may form one surface of the third part 331 and/or the fourth part 331 of the inner frame 330, 331. A coupling groove 334 may be formed on the support surface 331a of the inner frame 330, 331. The rear frame 130 and the inner frame 330 may be coupled by a screw SC inserted into the coupling groove 334. A receiving portion 333 may be formed by recessing or cutting out the upper surface of the sidewall 332. The pad AD or the adhesive pad AD may be positioned on or fixed to the receiving portion 333.

Figure 24:
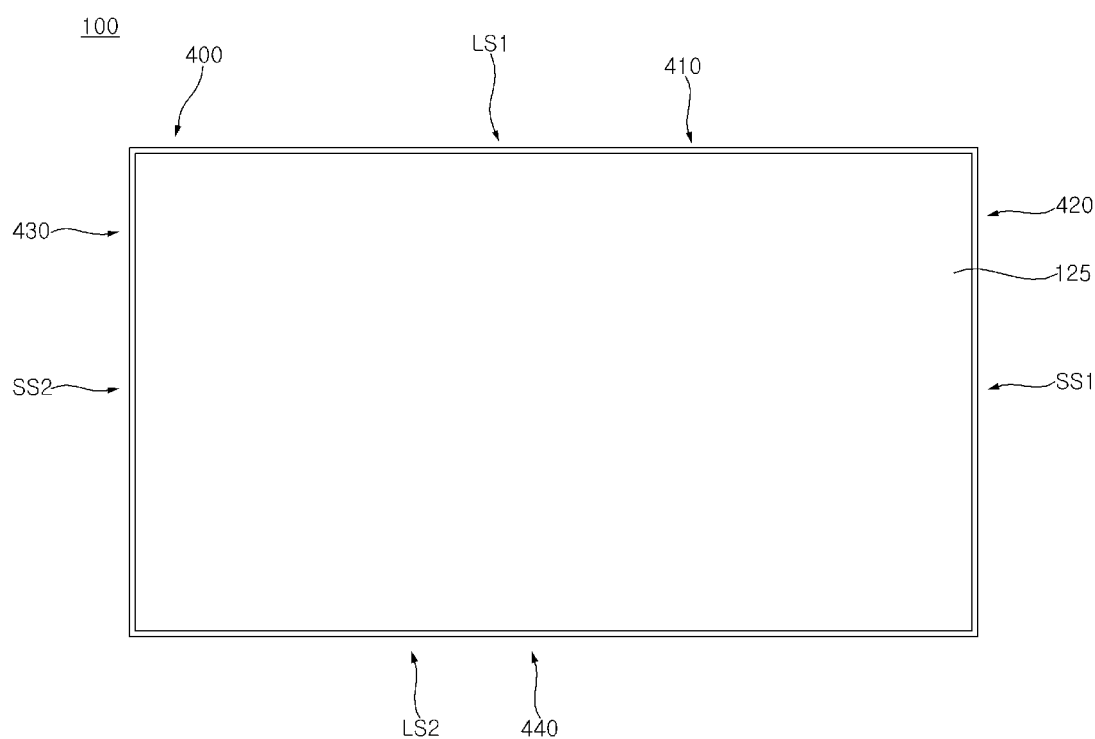
Figure 25:
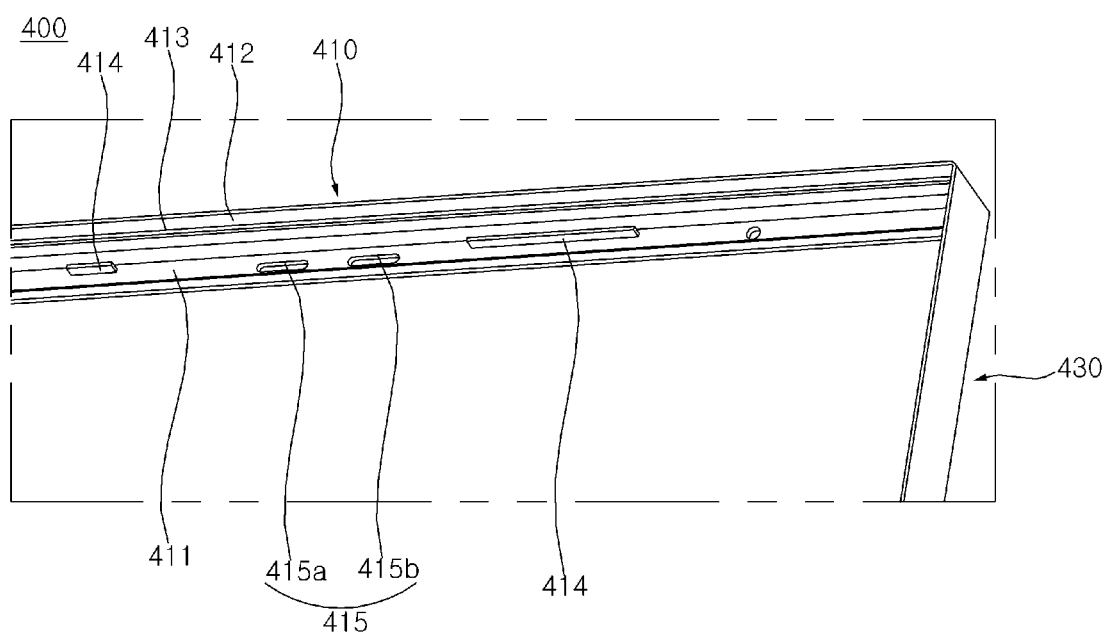
Figure 26:
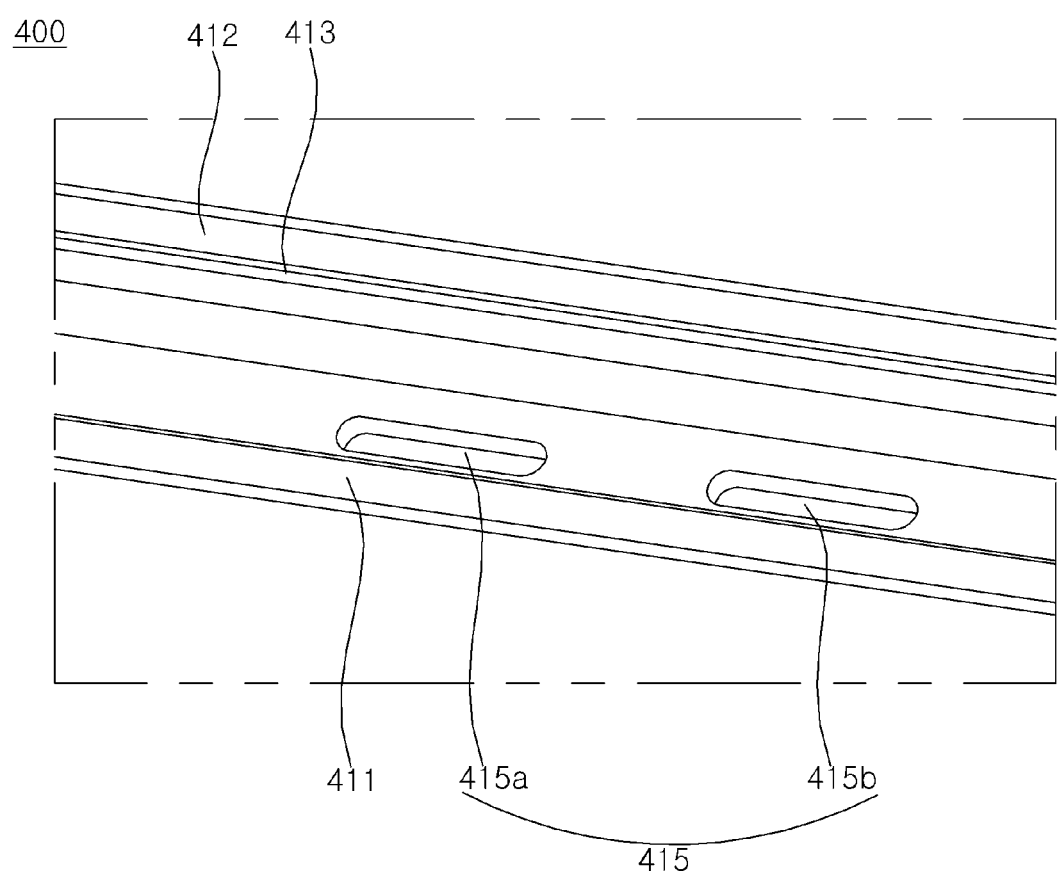

Referring to FIGS. 24 to 26, the optical layer 123 may be placed on the inner frame 310, 330. An outer frame 400 may be coupled to the inner frame 310, 330 while covering the circumference of the optical layer 123. The outer frame 400 may be referred to as a guide panel 400. The outer frame 410, 420, 430 may be coupled to the first short side SS1, the first long side LS1, and/or the second short side SS2 while the elongated frame 400 is bent. A separate outer frame 440 may be coupled to the second long side LS2.

The first part 410 of the outer frame 400 may include a horizontal portion 411 and a vertical portion 412. The description of the first part 410 may be applied to the second part 420 and/or the third part 430. The horizontal portion 411 may have an elongated plate shape. The vertical portion 412 may have a plate shape that is elongated while being bent from the horizontal portion 411. A rib hole 415 may be formed in the horizontal portion 411. There may be a plurality of rib holes 415. A first rib hole 415a may be an elongated long hole. A second rib hole 415b may be a long hole, and may be disposed in the length direction of the first rib hole 415a. The rib holes 415 may be formed to penetrate the horizontal portion 411.

A guide rib 414 may protrude from the horizontal portion 411 and extend long. The guide rib 414 may be parallel to the vertical portion 412. The rib holes 415 may be positioned between the guide ribs 414. A hook line 413 may be formed in the vertical portion 412. The hook line 413 may be formed while being adjacent to the guide rib 414 or facing the guide rib 414.

Figure 27:
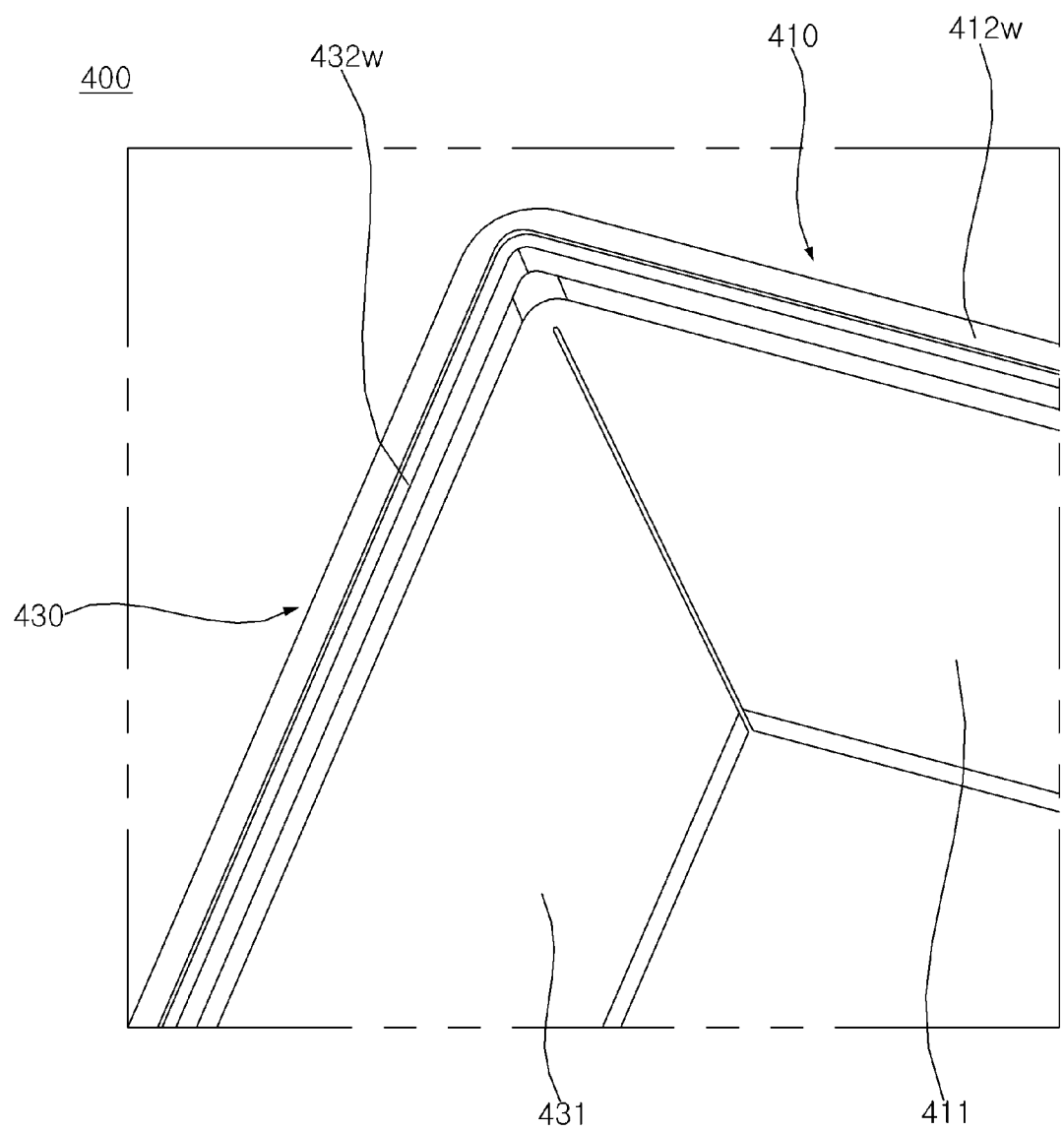

Referring to FIG. 27, the first part 410 may include a horizontal portion 411 and a vertical wall 412W. The vertical wall 412W may form a certain height from the horizontal portion 411. The third part 430 may include a horizontal portion 431 and a vertical wall 432W. The vertical wall 432W may form a certain height from the horizontal portion 431.

The vertical wall 412W of the first part 411 may be connected to the vertical wall 432W of the third part 430. A corner formed by the vertical wall 412W of the first part 411 and the vertical wall 432W of the third part 430 may be rounded. The vertical wall 412W of the first part 410 may form a gap with the vertical wall 432W of the third part 430.

Figure 28:
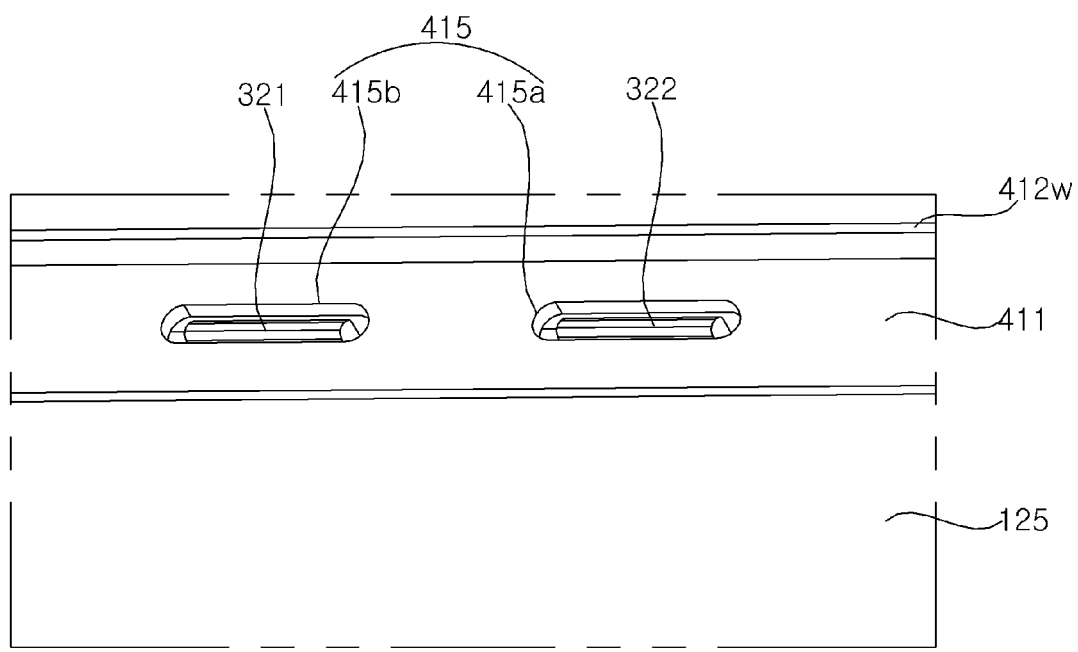
Figure 29:
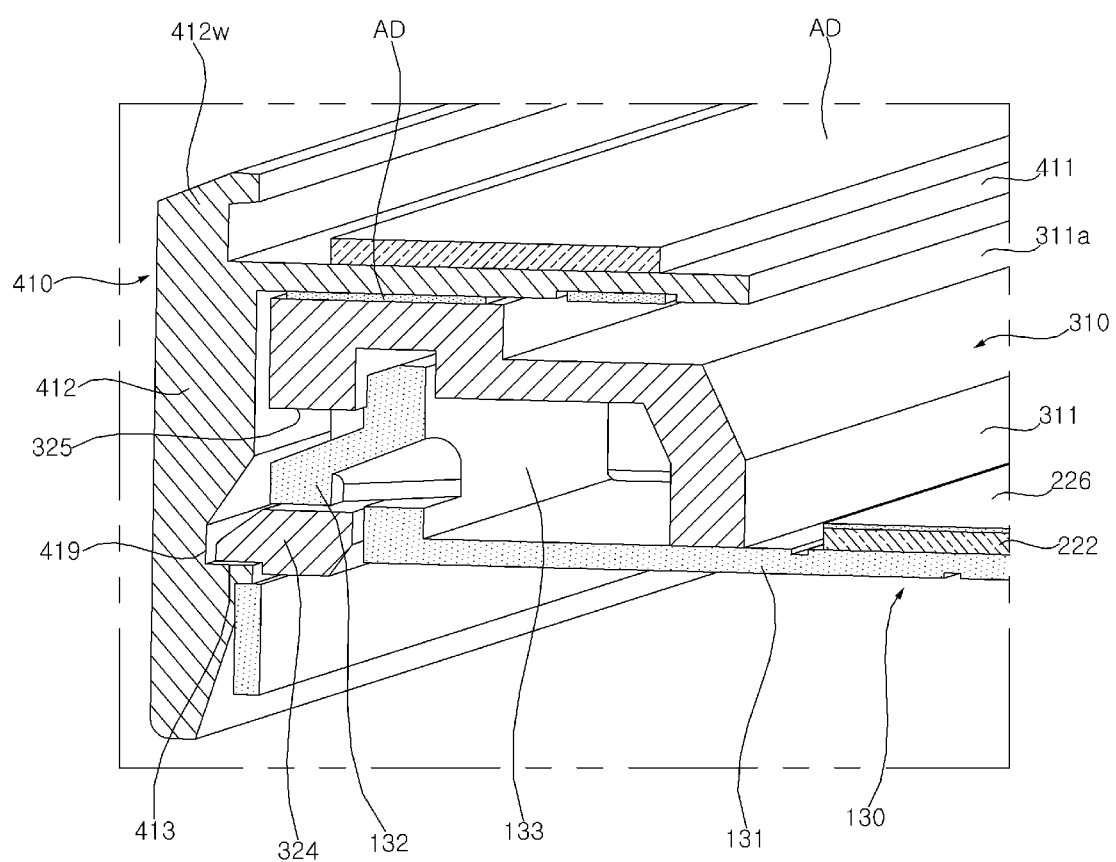

Referring to FIGS. 28 and 29, the outer frame 400 may be coupled to the rear frame 130 and/or the inner frame 310, 330 (see FIG. 17) while covering the optical sheet 125. The horizontal portion 411 of the outer frame 400 may be placed on the optical sheet 125, and the coupling ribs 321, 322 to which the optical sheet 125 is coupled may be inserted into the rib hole 415.

The pad AD or the adhesive member AD may be positioned in or fixed to the horizontal portion 411 of the outer frame 400. For example, the pad AD may be a double-sided tape having a certain thickness. The display panel 110 (see FIG. 30) may be placed on the outer frame 400, and fixed to the horizontal portion 411 by the pad AD.

Figure 30:
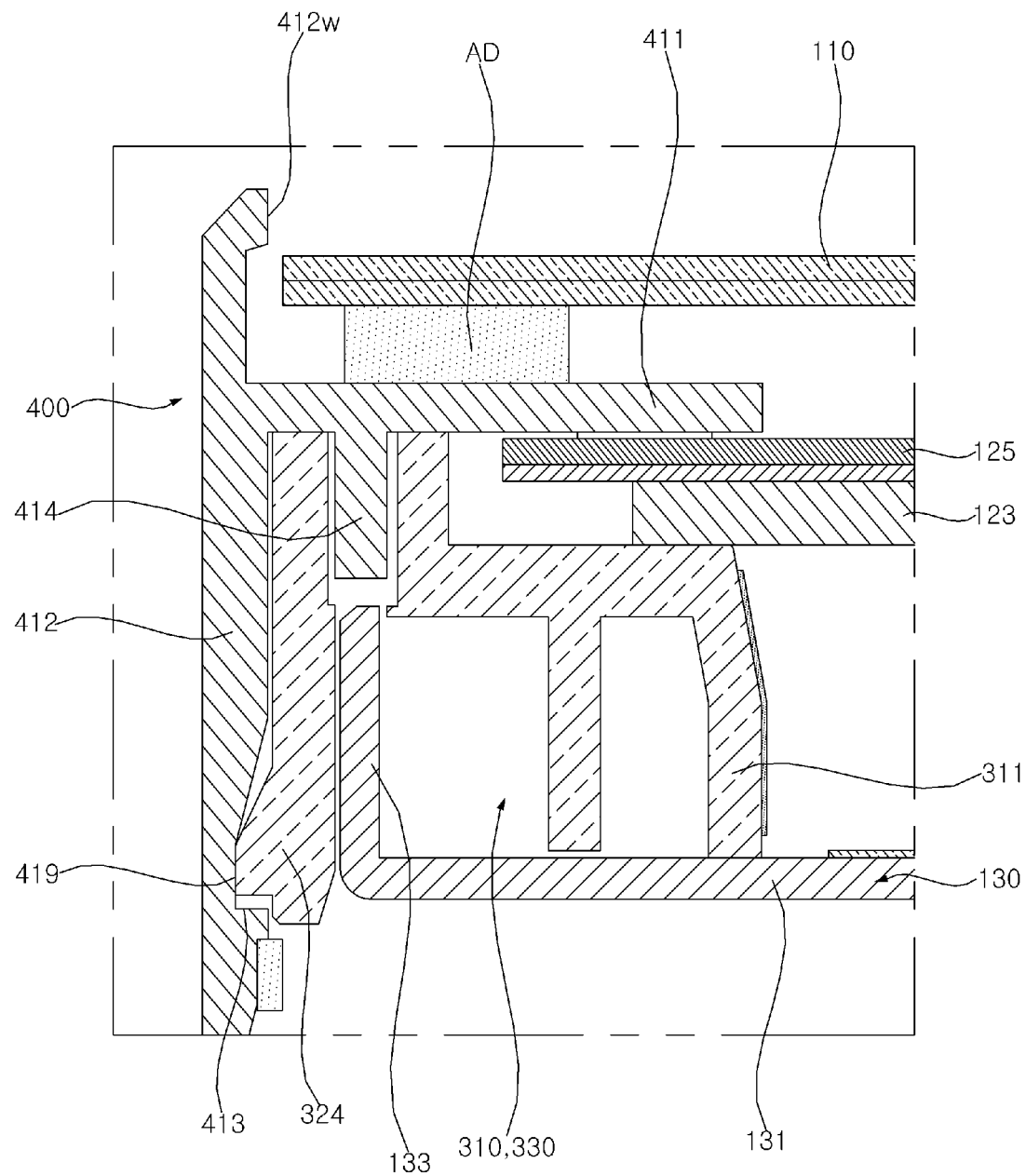

Referring to FIGS. 29 and 30, the center frame 311 of the inner frame 310 may be coupled to one side of the rear frame 130. The distal end of the bent rear frame 130 may be inserted into the center frame 311 of the inner frame 310. The protrusion 132 protruding to the outside of the rear frame 130 may be inserted into the coupling hole 325 of the inner frame 310.

The outer frame 410 may include a line groove 419. The line groove 419 may be formed in the vertical portion 412 of the outer frame 410. The locking protrusion 324 of the inner frame 310 may be inserted into the line groove 419 of the outer frame 410. The locking protrusion 324 of the inner frame 310 may be engaged with the hook line 413 of the outer frame 410.

The guide rib 414 of the outer frame 410 may be inserted into the inner frame 310. The guide rib 414 may be inserted into and fixed to the inner frame 310 while the outer frame 410 is placed on the inner frame 310.

The optical layer 123 and the optical sheet 125 are placed on the support surface 311a of the inner frame 310, and may be positioned between the support surface 311a of the inner frame 310 and the horizontal portion 411 of the outer frame 410. The display panel 110 may be placed on the horizontal portion 411 of the outer frame 410, and the vertical wall 412W may cover the side surface of the display panel 110.

Figure 31:
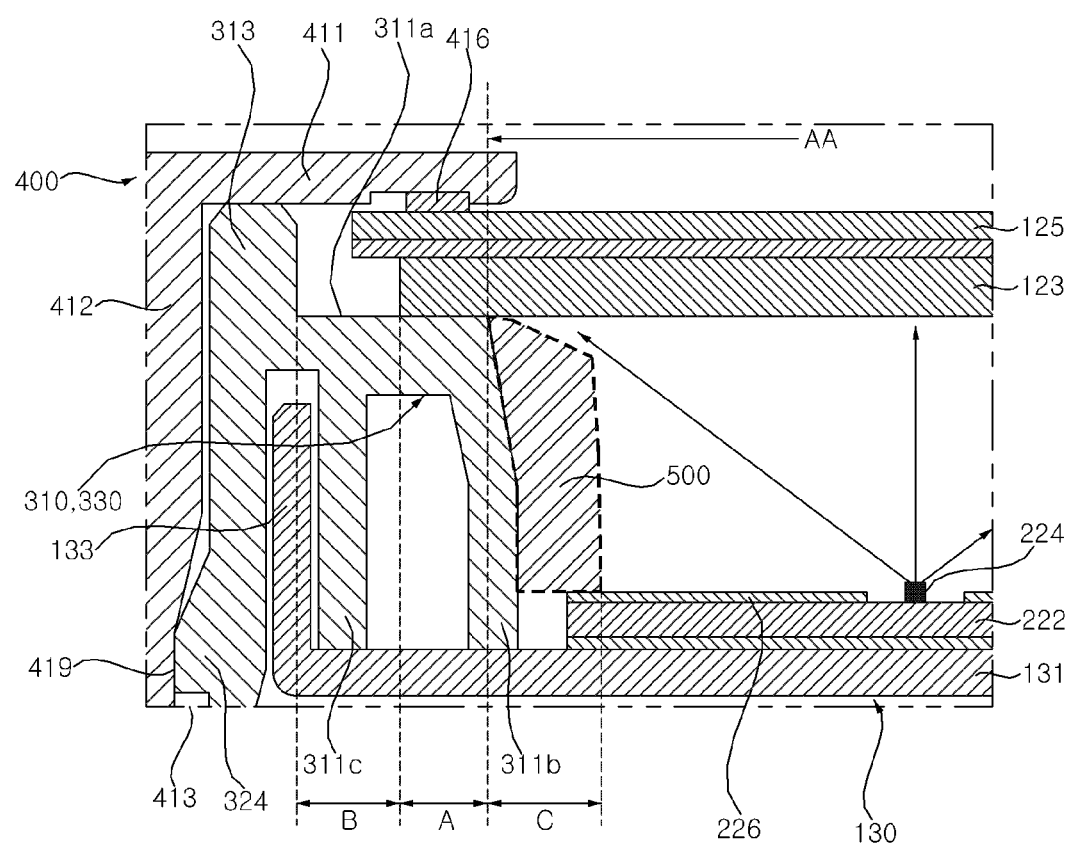
FIGS. 31 to 33 are diagrams illustrating examples of a side reflector of a display device according to embodiments of the present disclosure.

Referring to FIGS. 30 and 31, the frame 130 may include a rear plate 131 and a bending part 133. The rear plate 131 may be positioned in the rearward direction of the display panel 110, and may face the display panel 110. The bending part 133 may extend while being bent from the rear plate 131. The inner frame 310, 330 may be coupled to the frame 130. The bending part 133 may be inserted into the inner frame 310, 330.

The inner frame 310, 330 may include a support surface 311a, a frame wall 331, a front leg 311b, and a middle leg 311c. The support surface 311a may extend long and may face or be parallel to the rear plate 131 of the frame 130. The optical layer 123 may be placed on the support surface 311a of the inner frame 310, 330. The optical sheet 125 may be laminated on the optical layer 123. The frame wall 313 may protrude above the support surface 311a, and extend long in the extension direction of the support surface 311a. The frame wall 313 may cover the side surfaces of the optical layer 123 and the optical sheet 125, and face the side surfaces. The optical sheet 125 may be spaced apart from the frame wall 313 by a first distance B.

The middle coupler 324 may extend long from the frame wall 313, and may face or be in contact with the bending part 133. The middle leg 311c may extend from the support surface 311a, and may be parallel to the middle coupler 324. The middle leg 311c may be supported on the rear plate 131 of the frame 130. A gap or space may be formed between the middle leg 311c and the middle coupler 324, and the bending part 133 of the frame 130 may be inserted between the middle leg 311c and the middle coupler 324. The front leg 311b may extend long from the support surface 311a, and may be parallel to the middle leg 311c. A gap or a space may be formed between the front leg 311b and the middle leg 311c. The front leg 311b may be supported on the rear plate 131 of the frame 130.

The outer frame 400 may include a vertical portion 411 and a horizontal portion 412. The vertical portion 412 may cover the middle coupler 324 of the inner frame 310, 330. The vertical portion 412 may face or contact the middle coupler 324. The horizontal portion 412 may be connected to the vertical portion 412, and may cover the frame wall 313 of the inner frame 310, 330 and the optical sheet 125. The pad 416 may be positioned between the horizontal portion 411 and the optical sheet 125, and may be fixed or adhered to the horizontal portion 411. The pad 416 may adhere the optical layer 123 and/or the optical sheet 125 to the support surface 311a of the inner frame 310, 330.

The substrate 222 may be placed on the rear plate 131 of the frame 130. The reflective sheet 226 may be placed on the substrate 222.

A side reflector 500 may be coupled to or fixed to the front leg 311b of the inner frame 310, 330. The side reflector 500 may extend long to cover the front leg 311b of the inner frame 310, 330. The side reflector 500 may include a white material. The reflective sheet 226 may cover the outer surface of the side reflector 500. A fluorescent material may be coated on the outer surface of the side reflector 500. For example, the fluorescent material may include a green-based and/or red-based phosphor. Accordingly, it is possible to improve the yellowish phenomenon that may occur in an area adjacent to the side surface of the optical layer 123.

Figure 32:
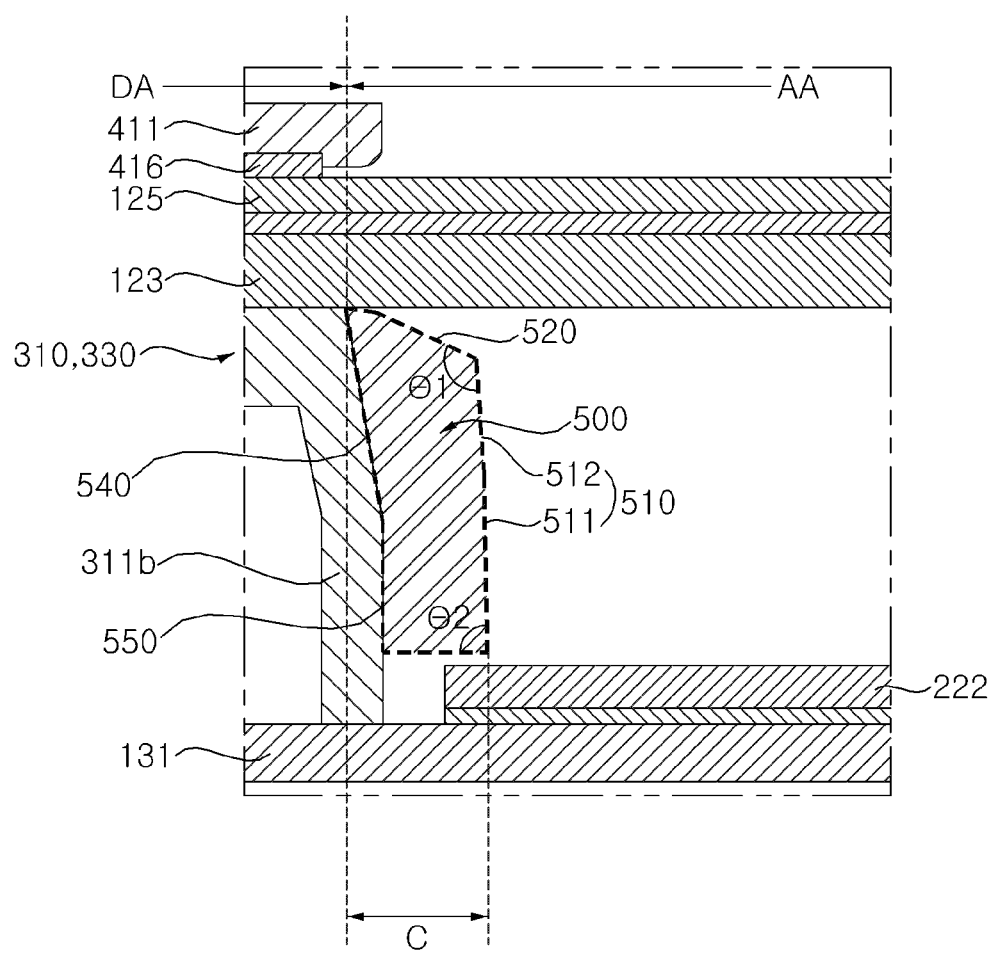

Referring to FIGS. 31 and 32, a second distance A between the front leg 311b and the middle leg 311c in the area where the optical layer 123 is in contact with the seating surface 311a may be substantially equal to a first distance B between the side surface of the optical layer 123 and the frame wall 313. The seating surface 311a may be referred to as the support surface 311a.

When the second distance A is greater than the first distance B, a bending phenomenon of the optical layer 123 may occur due to thermal expansion of the optical layer 123. As the optical layer 123 is bent, the optical sheet 125 is rubbed against the outer frame 400 and scratches may occur, so that the alignment of the display panel 110 may be damaged. Damage to the optical layer 123 and the optical sheet 125 may deteriorate the image quality of the display device.

When the second distance A is smaller than the first distance B, the optical layer 123 may be detached from the seating surface 311a due to the contraction of the optical layer 123. If the optical layer 123 is detached, an image defect may occur.

Figure 33:
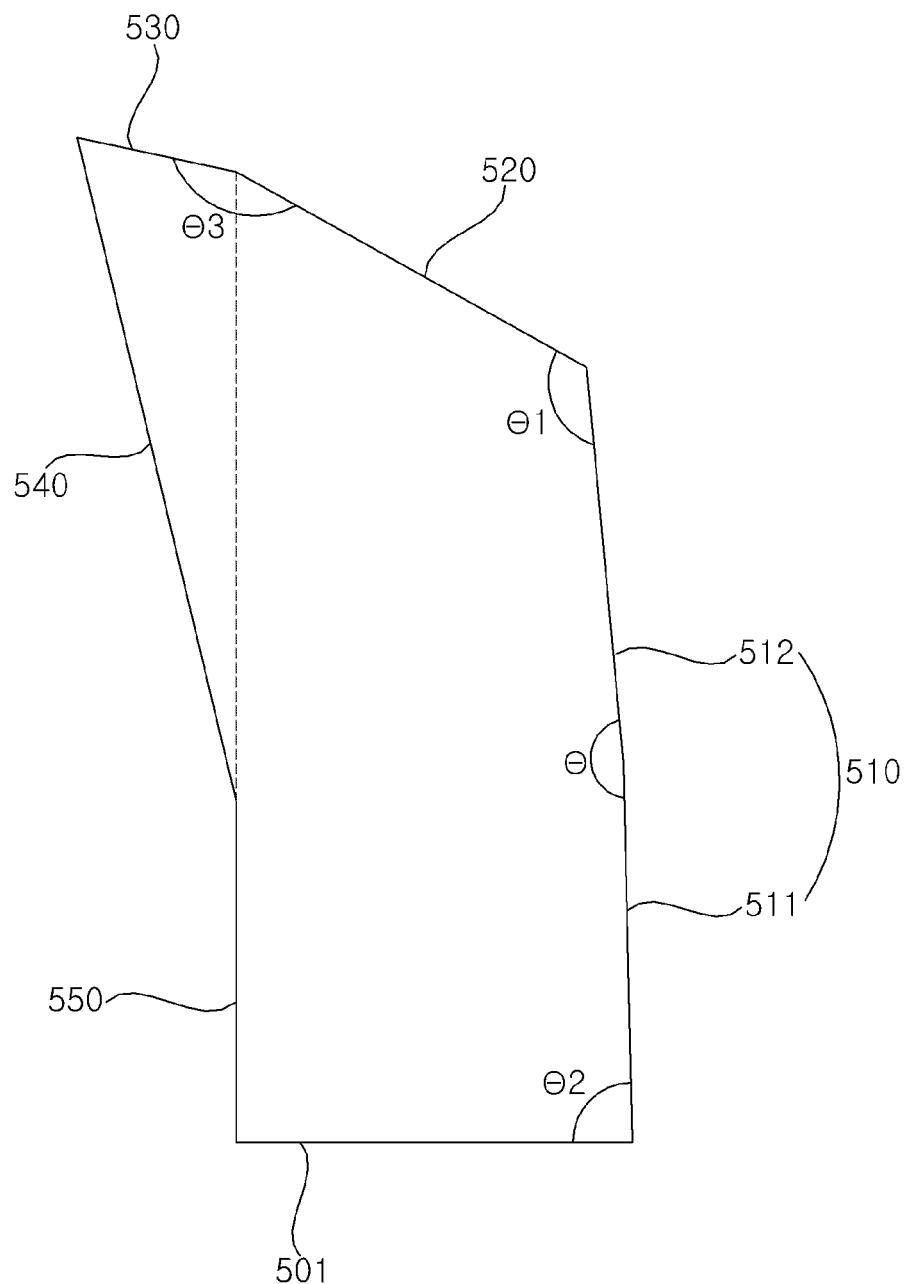

Referring to FIGS. 32 and 33, the side reflector 500 may include a first surface 510, a second surface 520, a third surface 530, a fourth surface 540, a fifth surface 550, and a base surface 501. The base surface 501 may face or be parallel to the substrate 222 and/or the rear plate 131. The base surface 501 may be spaced apart from the substrate 222.

A first surface 510 may extend from the base surface 501. The first surface 510 may form an outer surface. The first surface 510 may be referred to as a side surface 510. The first surface 510 may form a second angle theta 2 with respect to the base surface 501. The second angle theta 2 may be an acute angle. For example, the second angle theta 2 may be 85 to 90 degrees. The first surface 510 may include a plurality of surfaces. For example, the first surface 510 may form a polygonal surface. The first surface 510 may include a lower surface 511 and an upper surface 512. The lower surface 511 may be connected to the base surface 501, and the upper surface 512 may be connected to the second surface 520. The upper surface 512 may be a surface having a certain angle with respect to the lower surface 511. For example, the certain angle may be an obtuse angle.

The second surface 520 may be connected to the first surface 510. The second surface 520 may be referred to as a first inclination surface 520. The second surface 520 may form a certain first angle theta 1 with respect to the first surface 510. For example, the first angle theta 1 may be an obtuse angle. For example, the first angle theta 1 may be 110 degrees to 130 degrees. As another example, the first angle theta 1 may be 115 degrees to 125 degrees. The first angle theta 1 may be greater than the second angle theta 2. The second surface 520 may reflect light to the optical layer 123.

The third surface 530 may be connected to the second surface 520. The third surface 530 may be referred to as a second inclination surface 530. The third surface 530 may form a certain third angle theta 3 with respect to the second surface 520. For example, the third angle theta 3 may be an obtuse angle. The third angle theta 3 may be greater than the first angle theta 1. When the optical layer 123 is contracted, the third surface 530 may support the optical layer 123. When the optical layer 123 expands, the third surface 530 may reflect light to the optical layer 123. The first surface 510, the second surface 520, and/or the third surface 530 may be a reflective surface.

The fourth surface 540 may be connected to the third surface 530, and the fifth surface 550 may be connected to the base surface 501. The fifth surface 550 may be in contact with the fourth surface 540. The fourth surface 540 and the fifth surface 550 may be recessed to the inner side of the side reflector 500. The fourth surface 540 and/or the fifth surface 550 may contact or adhere to the front leg 311b of the inner plate 310, 330. The fourth surface 540 and/or the fifth surface 550 may be an adhesive surface.

A boundary between the second surface 520 and the third surface 530 may be positioned on an extension line of the fifth surface 550. The second surface 520 may correspond to an active area AA of the display panel 110, and the third surface 530 may correspond to an inactive area DA of the display panel 110.

Accordingly, the amount of light to be provided to the display panel 110 and the optical layer 123 may be increased, and structural stability of the optical layer 123 may be secured.

Referring to FIGS. 1 to 33, the display device includes: a display panel; a frame positioned in a rearward direction of the display panel; a substrate which is positioned on the frame, and has a light source providing light; an inner frame which is coupled to the frame, and supports the display panel; an optical layer which is positioned between the display panel and the inner frame, and in contact with the inner frame; and a side reflector which is positioned between the optical layer and the frame, and coupled to the inner frame, wherein the side reflector includes: a base surface positioned adjacent to the substrate; an inclination surface which is positioned adjacent to a lower surface of the optical layer, and reflects the light provided from the light source to the optical layer; and a side surface which connects the base surface and the inclination surface, and reflects the light provided by the light source.

The side reflector further includes an adhesive surface which connects the base surface and the inclination surface, and is fixed to the inner frame, wherein the inclination surface forms an acute angle with respect to the adhesive surface, and forms an obtuse angle with respect to the side surface.

The side surface includes: an upper surface connected to the inclination surface; and a lower surface connected to the base surface, wherein the upper surface is connected to the lower surface, and the upper surface forms an obtuse angle with respect to the lower surface.

The inclination surface includes: a first inclination surface connected to the side surface; and a second inclination surface connected to the adhesive surface.

The first inclination surface forms a first angle with respect to the side surface, and the second inclination surface forms a third angle with respect to the first inclination surface, wherein the first angle is different from the third angle.

The third angle is greater than the first angle.

The lower surface forms a second angle with respect to the base surface, wherein the second angle is an acute angle.

The first inclination surface corresponds to an image display area of the display panel, and the second inclination surface corresponds to an image non-display area of the display panel.

The inner frame includes a frame wall facing a side surface of the optical layer with respect to a seating surface, wherein a first distance from the frame wall to the side surface of the optical layer is substantially equal to a second distance in a direction of the first distance of an area in which a support surface and the optical layer are in contact.

A boundary between the second inclination surface and the adhesive surface supports the optical layer.

The effect of the display device according to the present disclosure will be described as follows.

According to at least one of the embodiments of the present disclosure, it is possible to provide a display device capable of improving luminance and light uniformity of a backlight unit.

According to at least one of the embodiments of the present disclosure, it is possible to provide a display device capable of improving luminance and light uniformity of a backlight unit.

According to at least one of the embodiments of the present disclosure, it is possible to provide a display device capable of effectively controlling light provided from a backlight unit.

According to at least one of the embodiments of the present disclosure, it is possible to improve the purity of white light by improving the bluish phenomenon of light provided from a backlight unit.

According to at least one of the embodiments of the present disclosure, it is possible to provide a coupling structure of a display device capable of improving luminance and light uniformity.

According to at least one of the embodiments of the present disclosure, it is possible to provide a display device that has a robust coupling structure while reducing an optical depth.

Certain embodiments or other embodiments of the disclosure described above are not mutually exclusive or distinct from each other. Any or all elements of the embodiments of the disclosure described above may be combined or combined with each other in configuration or function.

For example, a configuration "A" described in one embodiment of the disclosure and the drawings and a configuration "B" described in another embodiment of the disclosure and the drawings may be combined with each other. Namely, although the combination between the configurations is not directly described, the combination is possible except in the case where it is described that the combination is impossible.

Although embodiments have been described with reference to a number of illustrative embodiments thereof, it should be understood that numerous other modifications and embodiments can be devised by those skilled in the art that will fall within the scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art

What is claimed is:

1. A display device comprising:
   a display panel;
   a frame positioned in a rearward direction of the display panel;
   a substrate which is positioned on the frame, and which has a light source that provides light;
   an inner frame which is coupled to the frame, and which supports the display panel;
   an optical layer which is positioned between the display panel and the inner frame, and which is in contact with the inner frame; and
   a side reflector which is positioned between the optical layer and the frame, and which is coupled to the inner frame,
   wherein the side reflector comprises:
   a base surface positioned adjacent to the substrate;
   an inclination surface which is positioned adjacent to a lower surface of the optical layer, and which reflects the light, provided from the light source, to the optical layer; and
   a side surface which connects the base surface and the inclination surface, and which reflects the light provided by the light source.

2. The display device of claim 1,
   wherein the side reflector further comprises an adhesive surface which connects the base surface and the inclination surface, and which is fixed to the inner frame, and
   wherein the inclination surface forms an acute angle with respect to the adhesive surface, and forms an obtuse angle with respect to the side surface.

3. The display device of claim 2, wherein the side surface comprises:
   an upper surface connected to the inclination surface; and
   a lower surface connected to the base surface,
   wherein the upper surface is connected to the lower surface, and the upper surface forms an obtuse angle with respect to the lower surface.

4. The display device of claim 3, wherein the lower surface forms a second angle with respect to the base surface,
   wherein the second angle is an acute angle.

5. The display device of claim 2, wherein the inclination surface comprises:
   a first inclination surface connected to the side surface; and
   a second inclination surface connected to the adhesive surface.

6. The display device of claim 5, wherein the first inclination surface forms a first angle with respect to the side surface, and
   the second inclination surface forms a third angle with respect to the first inclination surface, and
   wherein the first angle is different from the third angle.

7. The display device of claim 6, wherein the third angle is greater than the first angle.

8. The display device of claim 5,
   wherein the first inclination surface corresponds to an image display area of the display panel, and
   the second inclination surface corresponds to an image non-display area of the display panel.

9. The display device of claim 8, wherein a boundary between the second inclination surface and the adhesive surface supports the optical layer.

10. The display device of claim 1,
    wherein the inner frame comprises a frame wall facing a side surface of the optical layer with respect to a seating surface, and
    wherein a first distance from the frame wall to the side surface of the optical layer is substantially equal to a second distance in a direction of the first distance of an area in which the seating surface and the optical layer are in contact.

* * * * *